US011527582B1

(12) United States Patent
Ran et al.

(10) Patent No.: US 11,527,582 B1
(45) Date of Patent: Dec. 13, 2022

(54) DISPLAY STACK WITH INTEGRATED PHOTODETECTORS

(71) Applicant: Apple Inc., Cupertino, CA (US)

(72) Inventors: Niva A. Ran, Palo Alto, CA (US); Aleksandr N. Polyakov, San Jose, CA (US); Lun Tsai, Zhubei (TW); Meng-Huan Ho, San Jose, CA (US); Mohammad Yeke Yazdandoost, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 91 days.

(21) Appl. No.: 17/006,708

(22) Filed: Aug. 28, 2020

Related U.S. Application Data

(60) Provisional application No. 62/905,301, filed on Sep. 24, 2019.

(51) Int. Cl.
*H01L 27/28* (2006.01)
*H01L 27/32* (2006.01)
*H01L 27/30* (2006.01)

(52) U.S. Cl.
CPC ........ *H01L 27/3227* (2013.01); *H01L 27/307* (2013.01); *H01L 27/323* (2013.01); *H01L 27/3209* (2013.01)

(58) Field of Classification Search
CPC ..... H01L 25/048; H01L 25/167; H01L 27/15; H01L 27/288; H01L 27/32;
(Continued)

(56) References Cited

U.S. PATENT DOCUMENTS 5,231,689 A    7/1993  Reidinger
6,349,159 B1   2/2002  Uebbing et al.
(Continued)

FOREIGN PATENT DOCUMENTS

CN    105531653    4/2016
CN    107180853    9/2017
(Continued)

OTHER PUBLICATIONS

Gelinck et al., "X-Ray Detector-on-Plastic With High Sensitivity Using Low Cost, Solution-Processed Organic Photodiodes," IEEE, 2015, pp. 1-8.
(Continued)

*Primary Examiner* — Samuel Park
(74) *Attorney, Agent, or Firm* — Brownstein Hyatt Farber Schreck, LLP

(57) ABSTRACT

An electronic device includes a frame and a display stack. The frame defines a first part of an interior volume. The display stack includes a cover attached to the frame. The cover may define a second part of the interior volume. The display stack also includes an array of organic light-emitting diodes (OLEDs) including an array of emissive electroluminescent (EL) regions, and at least one organic photodetector (OPD) disposed between the cover and at least one emissive EL region in the array of emissive electroluminescent regions. The at least one emissive EL region emits light through the at least one OPD. In alternative embodiments, the OLEDs may be stacked on the OPDs, or the OLEDs and OPDs may be interspersed with each other instead of stacked.

20 Claims, 18 Drawing Sheets

(58) Field of Classification Search
CPC ..... H01L 51/0032; H01L 51/05; H01L 51/00; H01L 27/3227; H01L 27/307; H01L 27/3209; H01L 27/323
See application file for complete search history.

(56) References Cited

U.S. PATENT DOCUMENTS

| | | | |
|---|---|---|---|
| 6,529,661 | B2 | 3/2003 | Kropp |
| 6,556,349 | B2 | 4/2003 | Cox et al. |
| 6,586,776 | B1 | 7/2003 | Liu |
| 6,910,812 | B2 | 6/2005 | Pommer |
| 6,919,681 | B2 | 7/2005 | Cok et al. |
| 6,946,647 | B1 | 9/2005 | O'Neill et al. |
| 6,948,820 | B2 | 9/2005 | Veligdan et al. |
| 7,021,833 | B2 | 4/2006 | Loh |
| 7,444,083 | B2 | 10/2008 | Ohashi et al. |
| 7,495,272 | B2 | 2/2009 | Maruyama et al. |
| 7,499,094 | B2 | 3/2009 | Kuriyama |
| 7,518,462 | B2 | 4/2009 | Kanno et al. |
| 7,706,073 | B2 | 4/2010 | Munro |
| RE41,673 | E | 9/2010 | Ma |
| 7,842,246 | B2 | 11/2010 | Wohlstadter et al. |
| 8,077,393 | B2 | 12/2011 | Steenblik |
| 8,305,400 | B2 | 11/2012 | Otani |
| 8,310,413 | B2 | 11/2012 | Fish et al. |
| 8,603,642 | B2 | 12/2013 | Hatwar et al. |
| 8,624,853 | B2 | 1/2014 | Han et al. |
| 8,625,058 | B2 | 1/2014 | Kozuma et al. |
| 8,664,655 | B2 | 3/2014 | Lee et al. |
| 8,743,027 | B2 | 6/2014 | Wu et al. |
| 8,780,065 | B2 | 7/2014 | Ribeiro et al. |
| 9,007,349 | B2 | 4/2015 | Tseng |
| 9,064,451 | B2 | 6/2015 | Lynch et al. |
| 9,070,648 | B2 | 6/2015 | de Jong et al. |
| 9,112,043 | B2 | 8/2015 | Arai |
| 9,183,779 | B2 | 11/2015 | Soto |
| 9,342,181 | B2 | 5/2016 | Wyatt et al. |
| 9,530,381 | B1 | 12/2016 | Bozarth et al. |
| 9,570,002 | B2 | 2/2017 | Sakariya et al. |
| 9,614,168 | B2 | 4/2017 | Zhang et al. |
| 9,633,247 | B2 | 4/2017 | Pope et al. |
| 9,741,286 | B2 | 8/2017 | Sakariya et al. |
| 9,762,329 | B2 | 9/2017 | Motohara |
| 9,870,075 | B2 | 1/2018 | Han et al. |
| 9,909,862 | B2 | 3/2018 | Ansari et al. |
| 9,947,901 | B2 | 4/2018 | Shedletsky et al. |
| 10,073,228 | B2 | 9/2018 | Polleux et al. |
| 10,079,001 | B2 | 9/2018 | Hodges |
| 10,090,574 | B2 | 10/2018 | Wu |
| 10,115,000 | B2 | 10/2018 | Mackey et al. |
| 10,222,475 | B2 | 3/2019 | Pacala |
| 10,290,266 | B2 | 5/2019 | Kurokawa |
| 10,331,939 | B2 | 6/2019 | He et al. |
| 10,410,036 | B2 | 9/2019 | He et al. |
| 10,410,037 | B2 | 9/2019 | He et al. |
| 10,453,381 | B2 | 10/2019 | Kurokawa |
| 10,474,286 | B2 | 11/2019 | Bae et al. |
| 10,551,662 | B2 | 2/2020 | Kimura et al. |
| 10,565,734 | B2 | 2/2020 | Bevensee et al. |
| 10,614,279 | B2 | 4/2020 | Kim et al. |
| 10,637,008 | B2 | 4/2020 | Harada et al. |
| 10,664,680 | B2 | 5/2020 | Xu et al. |
| 10,713,458 | B2 | 7/2020 | Bhat et al. |
| 10,748,476 | B2 | 8/2020 | Zhao et al. |
| 10,809,853 | B2 | 10/2020 | Klenkler et al. |
| 10,838,556 | B2 | 11/2020 | Yeke Yazdandoost et al. |
| 10,840,320 | B2 | 11/2020 | Yazdandoost et al. |
| 10,872,222 | B2 | 12/2020 | Gao et al. |
| 10,903,901 | B2 | 1/2021 | Mitchell |
| 2003/0148391 | A1 | 8/2003 | Salafsky |
| 2004/0209116 | A1 | 10/2004 | Ren et al. |
| 2005/0094931 | A1 | 5/2005 | Yokoyama et al. |
| 2011/0176086 | A1 | 7/2011 | Katoh et al. |
| 2012/0113357 | A1 | 5/2012 | Cheng et al. |
| 2013/0113733 | A1 | 5/2013 | Lim et al. |
| 2015/0309385 | A1 | 10/2015 | Shu et al. |
| 2015/0331508 | A1* | 11/2015 | Nho ............ H01L 27/323 345/173 |
| 2017/0068318 | A1* | 3/2017 | McClure ............ G06F 3/016 |
| 2017/0242506 | A1* | 8/2017 | Patel ............ G06F 3/041 |
| 2017/0270342 | A1 | 9/2017 | He et al. |
| 2018/0032778 | A1 | 2/2018 | Lang |
| 2018/0323243 | A1 | 11/2018 | Wang |
| 2018/0349667 | A1* | 12/2018 | Kim ............ G09G 5/00 |
| 2019/0034686 | A1 | 1/2019 | Ling et al. |
| 2019/0130155 | A1 | 5/2019 | Park |
| 2019/0221624 | A1 | 7/2019 | Lin et al. |
| 2019/0293849 | A1 | 9/2019 | Du et al. |
| 2020/0051499 | A1 | 2/2020 | Chung et al. |
| 2020/0083205 | A1* | 3/2020 | Ding ............ H01L 25/50 |
| 2020/0111851 | A1* | 4/2020 | Park ............ G06F 3/0412 |
| 2020/0209729 | A1 | 7/2020 | Chen et al. |
| 2020/0241138 | A1 | 7/2020 | Allen et al. |
| 2020/0265206 | A1 | 8/2020 | Chung et al. |
| 2020/0293741 | A1 | 9/2020 | Du |
| 2020/0342194 | A1 | 10/2020 | Bhat et al. |
| 2021/0014429 | A1 | 1/2021 | Alasirnio et al. |
| 2021/0050385 | A1 | 2/2021 | Chuang et al. |
| 2021/0064159 | A1 | 3/2021 | Yeke Yazdandoost et al. |
| 2021/0089741 | A1 | 3/2021 | Yeh et al. |
| 2021/0091342 | A1 | 3/2021 | Chen et al. |
| 2021/0255668 | A1 | 8/2021 | Xiang et al. |
| 2021/0287602 | A1 | 9/2021 | Chen et al. |
| 2021/0396935 | A1 | 12/2021 | Chen et al. |
| 2022/0035200 | A1 | 2/2022 | Chen et al. |
| 2022/0158141 | A1 | 5/2022 | Yuki et al. |

FOREIGN PATENT DOCUMENTS

| | | | |
|---|---|---|---|
| CN | 107271404 | 10/2017 | |
| CN | 107330426 | 11/2017 | |
| CN | 107515435 | 12/2017 | |
| CN | 108292361 | 7/2018 | |
| CN | 108885693 | 11/2018 | |
| CN | 108922918 A * | 11/2018 | ............ H01L 24/05 |
| CN | 109074475 | 12/2018 | |
| CN | 109791325 | 5/2019 | |
| CN | 109983471 | 7/2019 | |
| DE | 202004002512 | 3/2005 | |
| EP | 2463927 | 8/2013 | |
| EP | 3171254 | 5/2017 | |
| EP | 3404484 | 11/2018 | |
| EP | 3438880 | 2/2019 | |
| JP | H0642898 | 2/1994 | |
| JP | 6127447 | 5/2017 | |
| KR | 20050022260 | 3/2005 | |
| KR | 20180120055 A * | 10/2018 | ............ G06F 21/32 |
| WO | WO 17/204777 | 11/2017 | |
| WO | WO 18/093798 | 5/2018 | |
| WO | WO 18/186580 | 10/2018 | |
| WO | WO 18/210317 | 11/2018 | |

OTHER PUBLICATIONS

Garcia de Arquer et al., "Solution-processed semiconductors for next-generation photodetectors," *Nature Reviews—Materials*, 2017, vol. 2, No. 16100, pp. 1-16.
U.S. Appl. No. 17/466,813, filed Sep. 3, 2021, Vulis et al.
U.S. Appl. No. 17/028,775, filed Sep. 22, 2020, Yeke Yazdandoost et al.
U.S. Appl. No. 16/376,987, filed Apr. 5, 2019, Yeke Yazdandoost et al.
U.S. Appl. No. 16/791,905, filed Feb. 14, 2020, Xiang.
U.S. Appl. No. 16/815,875, filed Mar. 11, 2020, Chen et al.
U.S. Appl. No. 16/905,664, filed Jun. 18, 2020, Chen et al.
U.S. Appl. No. 16/945,643, filed Jul. 31, 2020, Chuang et al.
U.S. Appl. No. 16/945,174, filed Jul. 31, 2020, Chen et al.
U.S. Appl. No. 17/003,636, filed Aug. 26, 2020, Yeh et al.
U.S. Appl. No. 17/003,732, filed Aug. 26, 2020, Chen et al.

* cited by examiner

DISPLAY STACK WITH INTEGRATED PHOTODETECTORS

CROSS-REFERENCE TO RELATED APPLICATION

This application is a nonprovisional of and claims the benefit under 35 U.S.C. 119(e) of U.S. Provisional Patent Application No. 62/905,301, filed Sep. 24, 2019, the contents of which are incorporated herein by reference as if fully disclosed herein.

FIELD

The described embodiments generally relate to devices that include an electronic display and one or more photodetectors, such as phones, computers, watches, and so on having ambient light sensors, biometric sensors, cameras, depth sensors, and so on. More particularly, the described embodiments relate to the integration of photodetectors into a display stack.

BACKGROUND

Sensors are included in many of today's electronic devices, including electronic devices such as smartphones, computers (e.g., tablet computers or laptop computers), wearable electronic devices (e.g., electronic watches, smart watches, or health monitors), game controllers, navigation systems (e.g., vehicle navigation systems or robot navigation systems), and so on. Sensors may variously sense the presence of objects, distances to objects, proximities of objects, movements of objects (e.g., whether objects are moving, or the speed, acceleration, or direction of movement of objects), and so on. Some sensors may include a photodetector, or an array of photodetectors. A photodetector or array of photodetectors may be used, for example, to determine a proximity of an object. An array of photodetectors may be variously configured as an ambient light sensor, a light-emitting element (e.g., organic light-emitting element (OLED)) health sensor (e.g., age sensor), a touch sensor, a proximity sensor, a health sensor, a biometric sensor (e.g., a fingerprint sensor or facial recognition sensor), a camera, a depth sensor, and so on.

Given the wide range of sensor applications, any new development in the configuration or operation of a system including a sensor can be useful. New developments that may be particularly useful are developments that reduce the cost, size, complexity, part count, or manufacture time of the sensor or sensor system, or developments that improve the sensitivity or speed of sensor or sensor system operation.

SUMMARY

Embodiments of the systems, devices, methods, and apparatus described in the present disclosure are directed to the integration of a photodetector, or an array of photodetectors, into a display stack.

In a first aspect, the present disclosure describes an electronic device. The electronic device may include a frame and a display stack. The frame may define a first part of an interior volume. The display stack may include a cover attached to the frame. The cover may define a second part of the interior volume. The display stack may further include an array of organic light-emitting diodes (OLEDs) including an array of emissive electroluminescent (EL) regions, and at least one organic photodetector (OPD) disposed between the cover and at least one emissive EL region in the array of emissive electroluminescent regions. The at least one emissive EL region may emit light through the at least one OPD.

In a second aspect, the present disclosure describes another electronic device. The electronic device may include a display stack. The display stack may include an exterior structural component through which electronic images are viewed by a user, an array of OLEDs disposed below the exterior structural component, and an array of OPDs disposed below the array of OLEDs.

In a third aspect, the present disclosure describes yet another electronic device. The electronic device may include a cover, an array of OLEDs disposed under the cover and including an array of emissive EL regions, and an array of OPDs disposed under the cover. The emissive EL regions in the array of emissive EL regions may have a first set of axes perpendicular to the cover, and the OPDs in the array of OPDs may have a second set of axes perpendicular to the cover. The axes of the OPDs may be interspersed with axes of the emissive EL regions.

In addition to the exemplary aspects and embodiments described above, further aspects and embodiments will become apparent by reference to the drawings and by study of the following description.

BRIEF DESCRIPTION OF THE DRAWINGS

The disclosure will be readily understood by the following detailed description in conjunction with the accompanying drawings, wherein like reference numerals designate like structural elements, and in which.

Figure 1A:
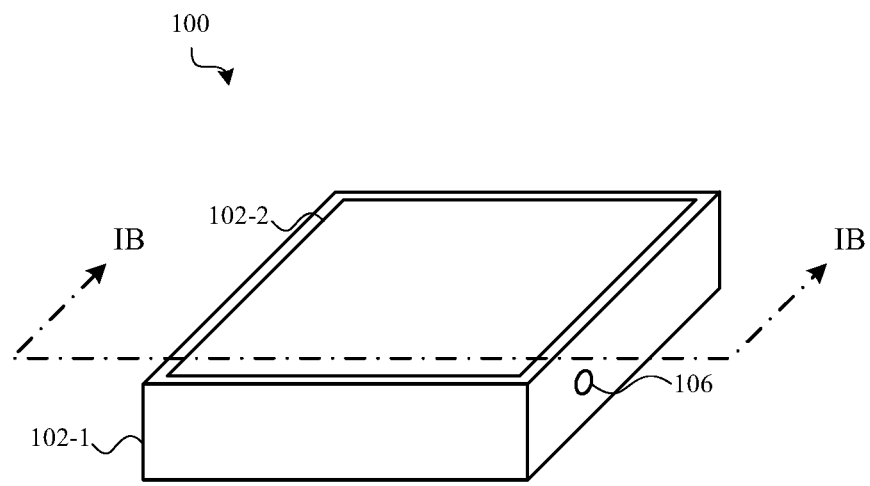
FIGS. 1A and 1B show an example of a device that may include an array of photodetectors.

The use of cross-hatching or shading in the accompanying figures is generally provided to clarify the boundaries between adjacent elements and also to facilitate legibility of the figures. Accordingly, neither the presence nor the absence of cross-hatching or shading conveys or indicates any preference or requirement for particular materials, material properties, element proportions, element dimensions, commonalities of similarly illustrated elements, or any other characteristic, attribute, or property for any element illustrated in the accompanying figures.

Additionally, it should be understood that the proportions and dimensions (either relative or absolute) of the various features and elements (and collections and groupings thereof) and the boundaries, separations, and positional relationships presented therebetween, are provided in the accompanying figures merely to facilitate an understanding of the various embodiments described herein and, accordingly, may not necessarily be presented or illustrated to scale, and are not intended to indicate any preference or requirement for an illustrated embodiment to the exclusion of embodiments described with reference thereto.

DETAILED DESCRIPTION

Reference will now be made in detail to representative embodiments illustrated in the accompanying drawings. It should be understood that the following description is not intended to limit the embodiments to one preferred embodiment. To the contrary, it is intended to cover alternatives, modifications, and equivalents as can be included within the spirit and scope of the described embodiments as defined by the appended claims.

Electronic devices are being designed with increasingly large displays, which in some cases may cover the entire front surface of a device. This reduces the real estate that was once available for various optical sensors. The following description therefore describes how to integrate a photodetector, or an array of photodetectors, into a display stack. In some cases, a photodetector and a light-emitting element (e.g., an OLED) may be stacked to achieve lateral space efficiency and/or a high fill of light-emitting elements.

A photodetector or array of photodetectors, integrated into a display stack, may be variously configured as an ambient light sensor, a light-emitting element (e.g., OLED) health sensor (e.g., age sensor), a touch sensor, a proximity sensor, a health sensor, a biometric sensor (e.g., a fingerprint sensor or facial recognition sensor), a camera, a depth sensor, and so on.

An array of photodetectors may be used, for example, for security, health monitoring, or entertainment purposes. For example, when used for security purposes, an array of photodetectors may be used to obtain biometric information, such as fingerprints, palm-prints, 3D face scans, or retina scans. The biometric information may then be used to identify or authenticate a user. When used for health monitoring purposes, an array of photodetectors may be used, for example, to acquire an electrocardiogram (ECG), pulse, or ophthalmic scan from a user. When used for entertainment purposes, an array of photodetectors may be used, for example, for palm reading, social networking, or social matching.

These and other techniques are described with reference to FIGS. 1A-12. However, those skilled in the art will readily appreciate that the detailed description given herein with respect to these figures is for explanatory purposes only and should not be construed as limiting.

Directional terminology, such as "top", "bottom", "upper", "lower", "front", "back", "over", "under", "beneath", "left", "right", etc. may be used with reference to the orientation of some of the components in some of the figures described below. Because components in various embodiments can be positioned in a number of different orientations, directional terminology is used for purposes of illustration only and is in no way limiting. The directional terminology is intended to be construed broadly, and therefore should not be interpreted to preclude components being oriented in different ways. The use of alternative terminology, such as "or", is intended to indicate different combinations of the alternative elements. For example, A or B is intended to include, A, or B, or A and B.

Figure 1B:
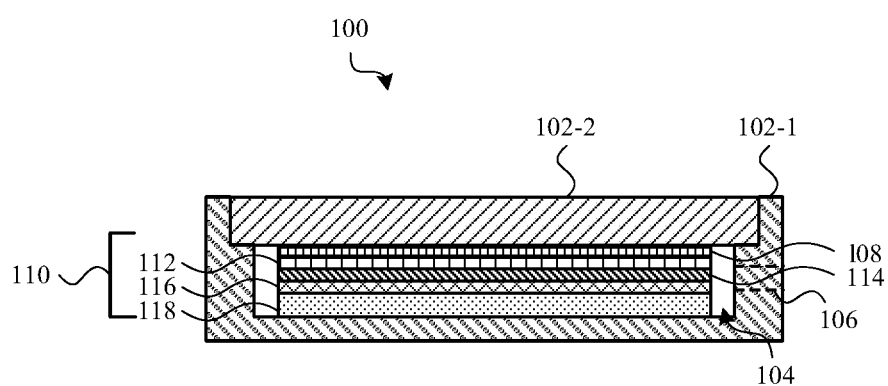

FIGS. 1A and 1B show an example of a device 100 that may include an array of photodetectors. The device 100 may include a housing 102 that defines an interior volume 104. FIG. 1A shows an isometric view of the device 100, and FIG. 1B shows a cross-section of the device 100 along line IB-IB.

The housing 102 may include, for example, a frame 102-1 and a cover 102-2. Each component of the housing (e.g., each of the frame 102-1 and the cover 102-2) may define a part of the interior volume 104. The frame 102-1 may further define an opening to the interior volume 104. In some cases, the frame 102-1 may be a multi-part frame, such as a frame formed by a support plate and one or more edge members extending from the support plate to support the cover 102-2. In some cases, the edge members may define a sidewall of the device 100. In some cases, the frame 102-1 may include metal and/or plastic components. In some cases, the cover 102-2 may be a transparent cover, such as a glass, sapphire, or plastic cover. The components of the housing 102 may be semi-permanently or detachably joined to one another by a set of fasteners, adhesives, seals, or other components. In some cases, the housing 102 may include different or additional components.

In some embodiments, the interior volume 104 may be sealed to prevent gases (e.g., air) or fluids (e.g., water) from entering or leaving the interior volume 104. In other embodiments, the interior volume 104 may not be sealed, thereby allowing gases and possibly fluids to enter or leave the interior volume 104. In some embodiments, the interior volume 104 may be vented. For example, an optional port 106 may be defined in frame 102-1 or another portion of the housing 102, and the port 106 may allow gases (e.g., air) but not fluids (e.g., water) to flow between the interior volume 104 and an ambient environment of the device 100.

As shown in FIG. 1B, a display 108 (i.e., an electronic display) may be disposed within the interior volume 104 and configured to emit or project light (e.g., light that defines an image) through the cover 102-2. The display 108 may be partially or completely surrounded by the frame 102-1 and/or covered by the cover 102-2, and in some cases may be mounted to the frame 102-1 and/or suspended from the cover 102-2. The display 108 may include one or more light-emitting elements or pixels, and in some cases may be a light-emitting diode (LED) display, an OLED display, a liquid crystal display (LCD), an electroluminescent (EL) display, a laser projector, or another type of electronic display.

In some embodiments, a stack 110 (or display stack, or device stack) including the display 108 (and in some cases the cover 102-2) may include, or be associated with, one or more touch and/or force sensors that are configured to detect a touch and/or force applied to an exterior surface of the cover 102-2. For example, the stack 110 may include a touch sensor 112 (or touch sensing system), and the touch sensor 112 may include, for example, a set of capacitive touch sensing elements, a set of resistive touch sensing elements, or a set of ultrasonic touch sensing elements. When a user of the device 100 touches the cover 102-2, the touch sensor 112 (or touch sensing system) may detect one or more touches on the cover 102-2 and indicate the locations of the touches on the cover 102-2. The touches may include, for example, touches by a user's finger or stylus.

The stack 110 may also include a force sensor 114 (or force sensing system), and the force sensor 114 may include, for example, a set of capacitive force sensing elements, a set of resistive force sensing elements, or one or more pressure transducers. When a user of the device 100 presses on the cover 102-2 (i.e., applies a force to the cover 102-2), the force sensor 114 may determine an amount of force applied to the cover 102-2 (or in some cases, the amount of force applied to a side or sides of the frame 102-1, a surface of the frame 102-1 opposite the cover 102-2, and so on). In some embodiments, the force sensor 114 may be used alone or in combination with the touch sensor 112 to determine a location of an applied force, or an amount of force associated with each touch in a set of multiple contemporaneous touches, or a location of a touch. In some embodiments, the force sensor 114 may additionally or alternatively include one or more force sensing elements disposed between the cover 102-2 and the frame 102-1 (e.g., to sense a capacitance or resistance, or a change in capacitance or resistance, between the cover 102-2 and the frame 102-1 or electrodes coupled thereto or positioned therebetween), or within the interior volume 104 (e.g., to sense a pressure, or change in pressure, within the interior volume 104).

As also shown in FIG. 1B, an array of photodetectors 116 (or at least one photodetector), a processor 118, and/or other components may also be positioned partly or wholly within the interior volume 104. The array of photodetectors 116 may extend over most or all of the surface area of the display 108, or may be limited to a particular one or more regions of the display 108. The array of photodetectors 116 and/or processor 118 may be mounted to the frame 102-1 and/or the cover 102-2. In some cases, the photodetectors in the array of photodetectors 116 may include organic photodetectors (OPDs). In some cases, the array of photodetectors 116 and/or processor 118 may be included in the stack 110. Some of the components (e.g., the processor 118) may alternatively be positioned entirely outside the interior volume 104, such as below a support plate or mid-plate of the frame 102-1 (not shown).

The processor 118 may be configured to operate one or more or all of the display 108, the touch sensor 112, the force sensor 114, or the array of photodetectors 116, and may be configured to receive, evaluate, propagate, or respond to signals obtained from the touch sensor 112, force sensor 114, and/or array of photodetectors 116.

In some embodiments, the array of photodetectors 116 (or at least one photodetector) may be variously configured (e.g., by the processor 118) as an ambient light sensor, a light-emitting element (e.g., OLED) health sensor (e.g., age sensor), a touch sensor, a proximity sensor, a health sensor, a biometric sensor (e.g., a fingerprint sensor or facial recognition sensor), a camera, a depth sensor, and so on. In some embodiments, different parts of the array of photodetectors 116 may be configured to provide different types of optical sensing contemporaneously. In some embodiments, part or all of the array of photodetectors 116 may be configured to perform different types of optical sensing at different times. Although the array of photodetectors 116 is shown positioned behind the display 108, the array of photodetectors 116 may alternatively be positioned in front of the display 108 (e.g., between the display 108 and the cover 102-2) or photodetectors in the array of photodetectors 116 may be interspersed with light-emitting elements of the display 108 (e.g., the photodetectors, and emissive regions of the display 108), may have axes that are perpendicular to the cover 102-2, and the axes of the photodetectors may be interspersed with the axes of the emissive regions.

When part or all of the array of photodetectors 116 is configured as an ambient light sensor, one or more photodetectors in the array may be configured to sense a visible light wavelength or range of visible light wavelengths, or different photodetectors may be configured to sense different visible light wavelengths or ranges of visible light wavelengths. In some embodiments, only one photodetector may be used as an ambient light sensor, or a number of photodetectors that is far less than (e.g., an order of magnitude less than) the number of light-emitting elements included in the display 108 may be used as an ambient light sensor.

When part or all of the array of photodetectors 116 is configured as a light-emitting element (e.g., OLED) health sensor (e.g., age sensor), a number of photodetectors equal to a number of light-emitting elements in the display 108 may be used (e.g., in a one-to-one photodetector-to-light-emitting elements correspondence) to monitor the health or age of the light-emitting elements. In these embodiments, outputs of the photodetectors may be analyzed by the processor 118, and the processor 118 may adjust aspects of the light-emitting elements (e.g., drive voltages, and so on) to compensate for aging or other health-related aspects of the light-emitting elements. In some cases, different photodetectors in the array may be filtered (e.g., color filtered) to detect different wavelengths of light emitted by differently filtered (e.g., differently color filtered) light-emitting elements.

When part or all of the array of photodetectors 116 is configured as a proximity, touch sensor, fingerprint sensor, and/or facial recognition sensor, the strengths of the signals output by the photodetectors in the array may vary based on the distance of an object (e.g., a finger) to the cover 102-2, or based on whether ridges or valleys of a fingerprint are positioned over the photodetectors, or based on what portions of a face are positioned in the fields of view of the photodetectors. In some embodiments, part or all of the array of photodetectors 116 may be used as a touch sensor in lieu of the touch sensor 112 (i.e., the touch sensor 112 may not be provided). Changes in the signals output by the photodetectors of the array may be analyzed by the processor 118 to identify not only the proximity of an object and/or an object's touch on the cover 102-2, but also movements of an object, on or off the cover 102-2, which movements may be correlated with one or more gestures. Photodetectors used as a proximity sensor may in some cases be configured (e.g., filtered or constructed) to detect visible and/or near infrared (NIR) electromagnetic radiation. In some cases, a NIR electromagnetic radiation source (or sources) may be positioned within or outside the boundary of the display 108, and may be activated to emit NIR electromagnetic radiation when part or all of the array of photodetectors 116 is activated to determine proximity and/or touch of an object. Photodetectors used as a fingerprint sensor may in some cases be configured (e.g., filtered or constructed) to detect blue and/or green light. When part or all of the array of photodetectors 116 is configured as a fingerprint sensor, a collimator may be positioned between the cover 102-2 and the array of photodetectors 116.

When part or all of the array of photodetectors 116 is configured as a health sensor, the photodetectors of the array may in some cases be configured (e.g., filtered or constructed) to detect visible and/or NIR electromagnetic radiation. In some cases, a NIR electromagnetic radiation source (or sources) may be positioned within or outside the boundary of the display 108, and may be activated to emit NIR electromagnetic radiation when part or all of the array of photodetectors 116 is activated to sense a health condition. Health conditions that may be sensed using part or all of the array of photodetectors 116 include, for example, a heart rate, a blood oxygenation level, or a vein image.

Figure 2A:
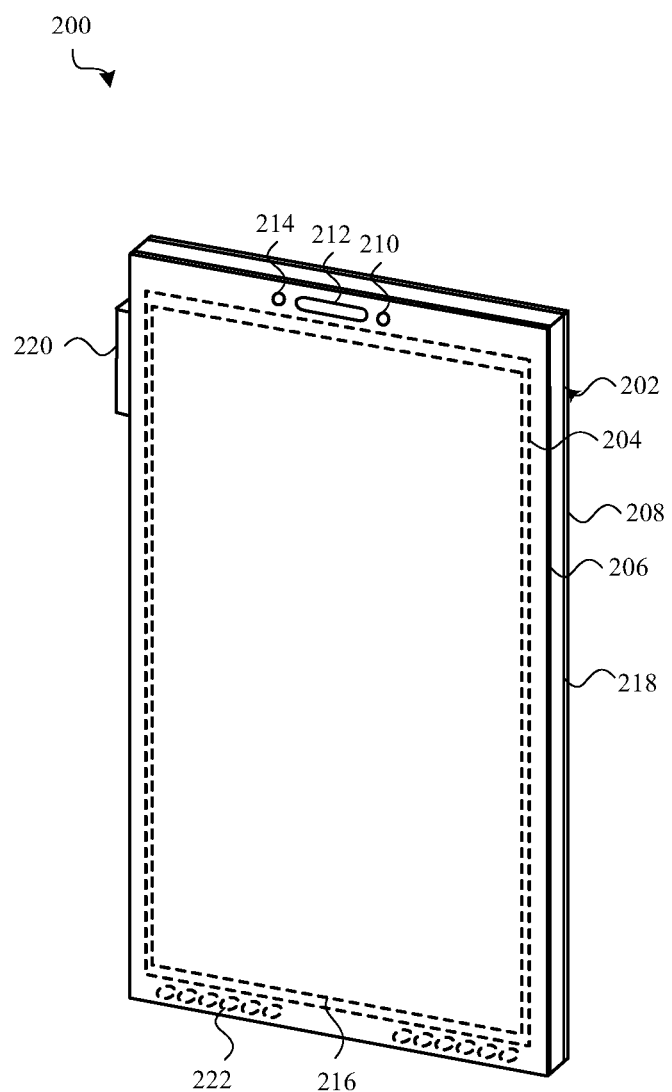
FIGS. 2A and 2B show another example of a device that may include an array of photodetectors.
Figure 2B:
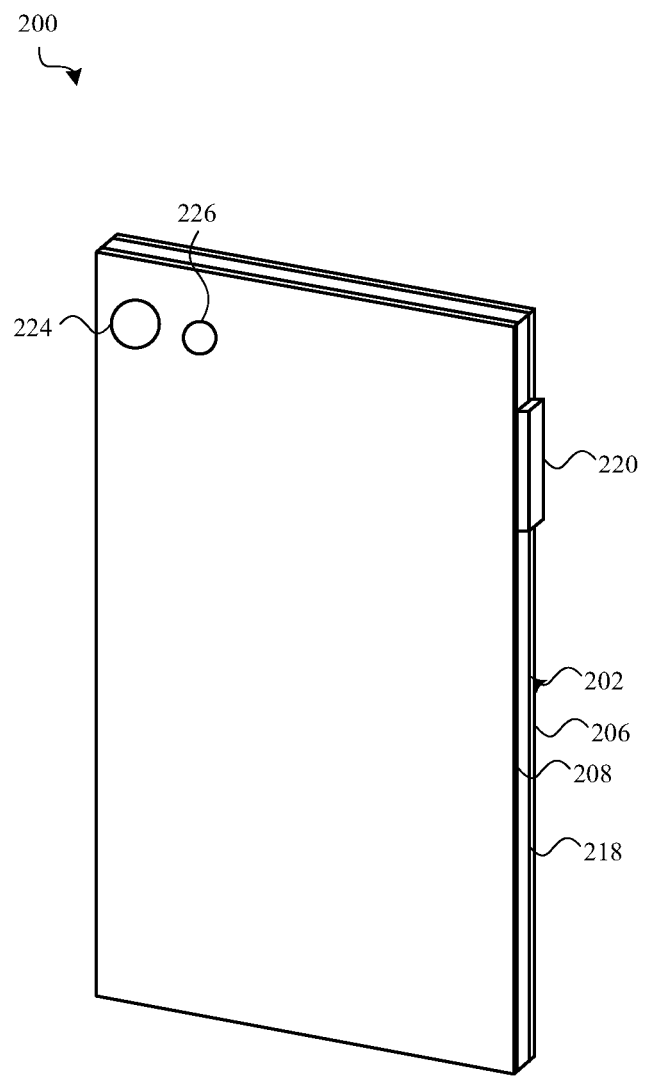

FIGS. 2A and 2B show another example of a device that may include an array of photodetectors. The device's dimensions and form factor, including the ratio of the length of its long sides to the length of its short sides, suggest that the device 200 is a mobile phone (e.g., a smartphone). However, the device's dimensions and form factor are arbitrarily chosen, and the device 200 could alternatively be any portable electronic device including, for example a mobile phone, tablet computer, portable computer, portable music player, electronic watch, health monitoring device, portable terminal, vehicle navigation system, robot navigation system, or other portable or mobile device. The device 200 could also be a device that is semi-permanently located (or installed) at a single location (e.g., a door lock, thermostat, refrigerator, or other appliance). FIG. 2A shows a front isometric view of the device 200, and FIG. 2B shows a rear isometric view of the device 200. The device 200 may include a housing 202 that at least partially surrounds a display 204. The housing 202 may include or support a front cover 206 or a rear cover 208. The front cover 206 may be positioned over the display 204, and may provide a window through which the display 204 (including images displayed thereon) may be viewed by a user. In some embodiments, the display 204 may be attached to (or abut) the housing 202 and/or the front cover 206.

The display 204 may include one or more light-emitting elements or pixels, and in some cases may be an LED display, an OLED display, an LCD, an EL display, a laser projector, or another type of electronic display. In some embodiments, the display 204 may include, or be associated with, one or more touch and/or force sensors that are configured to detect a touch and/or a force applied to a surface of the front cover 206.

The various components of the housing 202 may be formed from the same or different materials. For example, a sidewall 218 of the housing 202 may be formed using one or more metals (e.g., stainless steel), polymers (e.g., plastics), ceramics, or composites (e.g., carbon fiber). In some cases, the sidewall 218 may be a multi-segment sidewall including a set of antennas. The antennas may form structural components of the sidewall 218. The antennas may be structurally coupled (to one another or to other components) and electrically isolated (from each other or from other components) by one or more non-conductive segments of the sidewall 218. The front cover 206 may be formed, for example, using one or more of glass, a crystal (e.g., sapphire), or a transparent polymer (e.g., plastic) that enables a user to view the display 204 through the front cover 206. In some cases, a portion of the front cover 206 (e.g., a perimeter portion of the front cover 206) may be coated with an opaque ink to obscure components included within the housing 202. The rear cover 208 may be formed using the same material(s) that are used to form the sidewall 218 or the front cover 206, or may be formed using a different material or materials. In some cases, the rear cover 208 may be part of a monolithic element that also forms the sidewall 218 (or in cases where the sidewall 218 is a multi-segment sidewall, those portions of the sidewall 218 that are non-conductive). In still other embodiments, all of the exterior components of the housing 202 may be formed from a transparent material, and components within the device 200 may or may not be obscured by an opaque ink or opaque structure within the housing 202.

The front cover 206 may be mounted to the sidewall 218 to cover an opening defined by the sidewall 218 (i.e., an opening into an interior volume in which various electronic components of the device 200, including the display 204, may be positioned). The front cover 206 may be mounted to the sidewall 218 using fasteners, adhesives, seals, gaskets, or other components.

A display stack or device stack (hereafter referred to as a "stack") including the display 204 (and in some cases the front cover 206) may be attached (or abutted) to an interior surface of the front cover 206 and extend into the interior volume of the device 200. In some cases, the stack may also include a touch sensor (e.g., a grid of capacitive, resistive, strain-based, ultrasonic, or other type of touch sensing elements), or other layers of optical, mechanical, electrical, or other types of components. In some cases, the touch sensor (or part of a touch sensor system) may be configured to detect a touch applied to an outer surface of the front cover 206 (e.g., to a display surface of the device 200).

The stack may also include an array of photodetectors 216, with the photodetectors positioned in front of or behind, or interspersed with, the light-emitting elements of the display 204. The array of photodetectors 216 may extend across an area equal in size to the area of the display 204. Alternatively, the array of photodetectors 216 may extend across an area that is smaller than or greater than the area of the display 204. Although the array of photodetectors 216 is shown to have a rectangular boundary, the array could alternatively have a boundary with a different shape, including, for example, an irregular shape. The array of photodetectors 216 may be variously configured as an ambient light sensor, a light-emitting element (e.g., OLED) health sensor (e.g., age sensor), a touch sensor, a proximity sensor, a health sensor, a biometric sensor (e.g., a fingerprint sensor or facial recognition sensor), a camera, a depth sensor, and so on. The array of photodetectors 216 may also function as a proximity sensor, for determining whether an object (e.g., a finger, face, or stylus) is proximate to the front cover 206, or as any of the sensor types described with reference to FIGS. 1A-1B. In some embodiments, the array of photodetectors 216 may provide the touch sensing capability (i.e., touch sensor) of the stack.

In some cases, a force sensor (or part of a force sensor system) may be positioned within the interior volume below and/or to the side of the display 204 (and in some cases within the stack). The force sensor (or force sensor system) may be triggered in response to the touch sensor detecting one or more touches on the front cover 206 (or indicating a location or locations of one or more touches on the front cover 206), and may determine an amount of force associated with each touch, or an amount of force associated with the collection of touches as a whole.

As shown primarily in FIG. 2A, the device 200 may include various other components. For example, the front of the device 200 may include one or more front-facing cameras 210 (including one or more image sensors), speakers 212, microphones, or other components 214 (e.g., audio, imaging, and/or sensing components) that are configured to transmit or receive signals to/from the device 200. In some cases, a front-facing camera 210, alone or in combination with other sensors, may be configured to operate as a bio-authentication or facial recognition sensor. Additionally or alternatively, the array of photodetectors 216 may be configured to operate as a front-facing camera 210, a bio-authentication sensor, or a facial recognition sensor.

The device 200 may also include buttons or other input devices positioned along the sidewall 218 and/or on a rear surface of the device 200. For example, a volume button or multipurpose button 220 may be positioned along the sidewall 218, and in some cases may extend through an aperture in the sidewall 218. The sidewall 218 may include one or more ports 222 that allow air, but not liquids, to flow into and out of the device 200. In some embodiments, one or more sensors may be positioned in or near the port(s) 222. For example, an ambient pressure sensor, ambient temperature sensor, internal/external differential pressure sensor, gas sensor, particulate matter concentration sensor, or air quality sensor may be positioned in or near a port 222.

In some embodiments, the rear surface of the device 200 may include a rear-facing camera 224. A flash or light source 226 may also be positioned along the rear of the device 200 (e.g., near the rear-facing camera). In some cases, the rear surface of the device 200 may include multiple rear-facing cameras.

Figure 3:
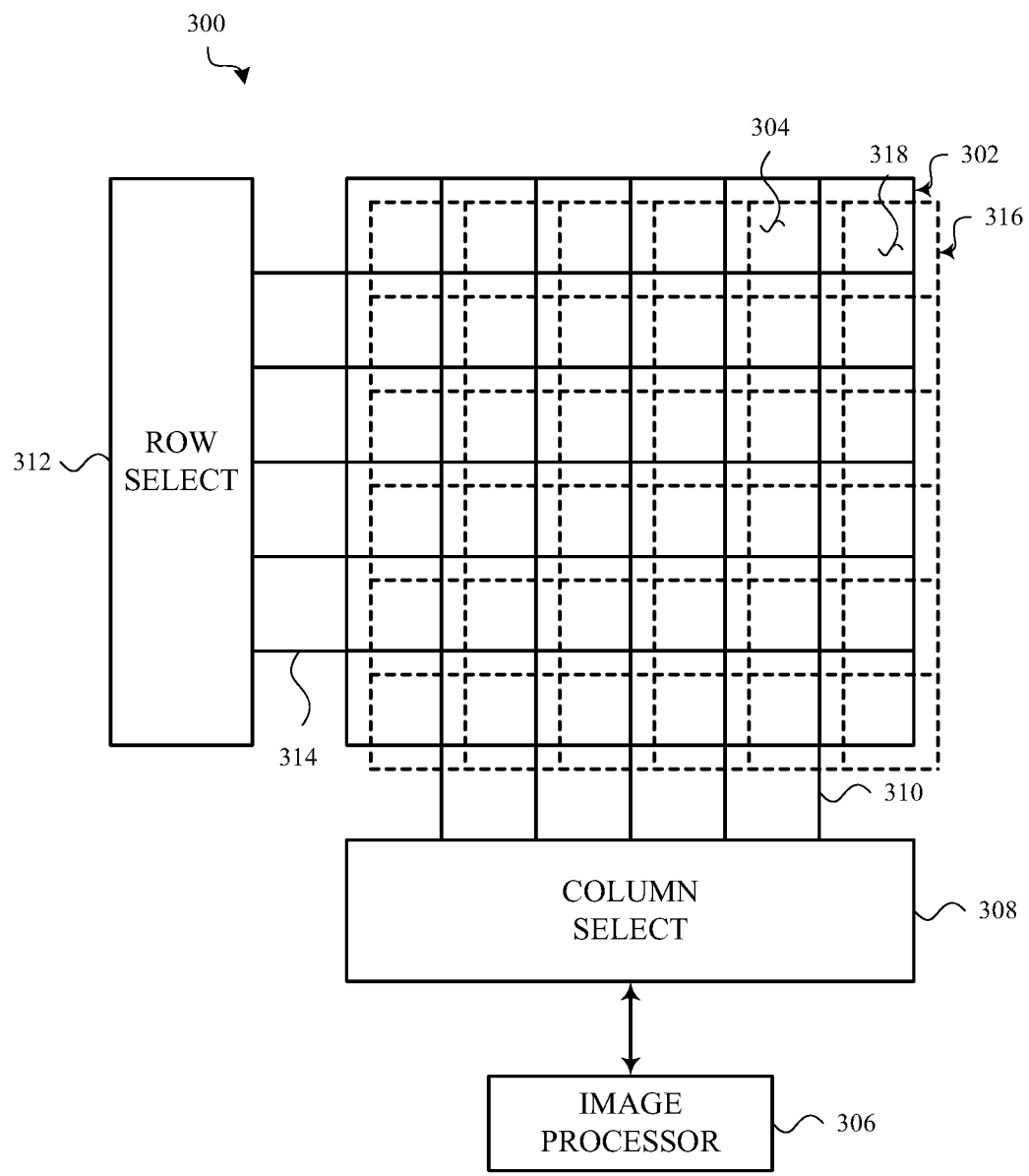
FIG. 3 shows an example plan view of arrays of light-emitting elements and photodetectors that may be included in a stack positioned under the cover of the device described with reference to FIG. 1A-1B or 2A-2B.

FIG. 3 shows an example plan view of arrays 300 of light-emitting elements and photodetectors that may be included in a stack positioned under the cover of the device described with reference to FIG. 1A-1B or 2A-2B.

A first array 302 may include a set of photodetectors 304. The set of photodetectors 304 may be coupled to an image processor 306. The set of photodetectors 304 may detect the same wavelength of electromagnetic radiation or different wavelengths of electromagnetic radiation. In the illustrated embodiment, the set of photodetectors 304 is arranged in rows and columns. However, the set of photodetectors 304 may alternatively be arranged in any suitable configuration, such as, for example, a hexagonal configuration.

The first array 302 may be in communication with a column select circuit 308 through one or more column select lines 310, and with a row select circuit 312 through one or more row select lines 314. The row select circuit 312 may selectively activate a particular photodetector 304 or group of photodetectors, such as all of the photodetectors 304 in a row. The column select circuit 308 may selectively receive the data output from a selected photodetector 304 or group of photodetectors 304 (e.g., all of the photodetectors 304 in a row).

The row select circuit 312 and/or column select circuit 308 may be in communication with the image processor 306. The image processor 306 may process data received from the photodetectors 304 and provide that data to another processor (e.g., a system processor) and/or other components of a device (e.g., other components of the device described with reference to FIG. 1A-1B or 2A-2B).

In some embodiments, the first array 302 may be configured as a rolling shutter image sensor, in which different rows or columns of photodetectors 304 are sequentially enabled and read out. In other embodiments, the first array 302 may be configured as a global shutter image sensor, in which all of the photodetectors 304 are enabled at once, charges integrated by the photodetectors 304 are locally stored, and then the charges are read out by row or column.

A second array 316 may include a set of light-emitting elements 318 defining a display. The first and second arrays 302, 316 may be stacked, such that the first array 302 is positioned in front of or behind the second array 316 when an image projected by the display is viewed by a user. Alternatively, photodetectors and light-emitting elements of the first and second arrays 302, 316 may be interspersed. In these latter embodiments, the photodetectors 304 may be positioned in front of, behind, or alongside the light-emitting elements 318 of the display.

Figure 4:
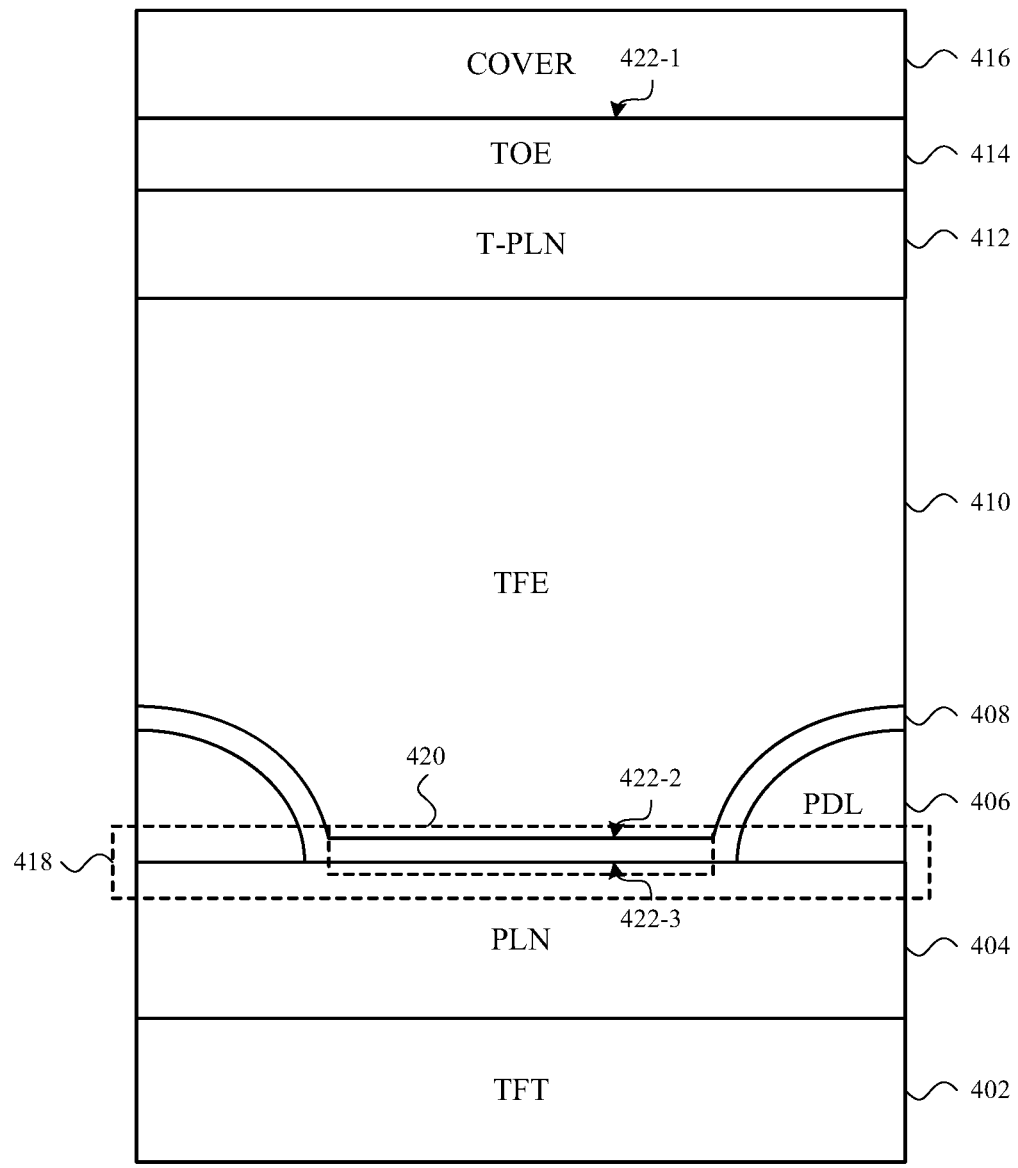
FIG. 4 shows an example elevation of a stack (e.g., a display stack or device stack)

FIG. 4 shows an example of a stack 400 (e.g., a display stack or device stack). In some embodiments, the stack 400 may be part or all of the stack described with reference to FIG. 1A-1B or 2A-2B.

By way of example, the stack 400 may include one or more thin-film transistor (TFT) layers (e.g., a TFT backplane 402, and in some cases a Low-Temperature Polycrystalline Oxide (LTPO) backplane). A planarization (PLN) layer 404 (e.g., a thin-film PLN) may be deposited directly or indirectly on, or formed on or above, the TFT backplane 402. A pixel define layer (PDL) 406 (e.g., a thin-film PDL) may be deposited directly or indirectly on, or formed on or above, the PLN layer 404. An organic material 408 (e.g., a thin-film organic material) may be deposited directly or indirectly on, or formed on or above, the PDL 406. A thin-film encapsulation (TFE) layer 410 may be deposited directly or indirectly on, or formed on or above, the organic material 408. a touch sensor PLN (T-PLN) layer 412 may be deposited directly or indirectly on, or formed on or above, the TFE layer 410. An optional touch sensor 414 (e.g., a touch-on-encapsulation (TOE) thin-film touch sensor) may be deposited directly or indirectly on, or formed on or above, the T-PLN layer 412. Alternatively, another type of touch sensor technology may be used (e.g., a dual indium tin oxide (DITO) touch sensor or other type of touch sensor), and the touch sensor may be positioned where the touch sensor 414 is shown, or in other locations (e.g., on top of the cover 416). In other embodiments, a touch sensor may not be included in the stack 400. The layers 402-414 may be attached to (e.g., adhesively bonded to) a cover 416.

In some embodiments, the stack 400 may include more, fewer, or different layers or components. For example, a polarizer may be deposited directly or indirectly on the touch sensor 414 or interior surface of the cover 416. A number of electrodes (e.g., conductive traces in metal layers) may also be included in the stack 400. In some embodiments, the layers 402-416 of the stack 400 may have different orders, or may include multiple layers. For example, the TFT backplane 402 may include multiple layers, the PLN layer 404 may include multiple layers, and so on.

The TFT backplane 402, PDL 406, and organic material 408 may define an array of light-emitting and/or light-sensing elements (or units). In some embodiments, the TFT backplane 402, PDL 406, and organic material 408 may define an array of OLEDs having an array of emissive EL regions (e.g., one emissive EL region per OLED). Each OLED 418 may include an emissive EL region 420, from which electromagnetic radiation (e.g., visible light or NIR electromagnetic radiation) is emitted toward the cover 416.

The stack 400 may also include at least one photodetector 422, or an array of photodetectors 422. Each photodetector 422 may be provided at various locations in the stack 400. For example, one or more photodetectors 422 may be provided between the touch sensor 414 and the cover 416, at a location 422-1. Alternatively, one or more photodetectors 422 may be provided between the organic material 408 and the TFE layer 410, at a location 422-2. Alternatively, one or more photodetectors 422 may be provided between the PLN layer 404 or PDL layer 406 and the organic material 408, at a location 422-3. Alternatively, one or more photodetectors 422 may be provided alongside emissive EL regions 420. For example, the organic material 408 may include different types of organic material, including organic material configured to emit electromagnetic radiation having one or more wavelengths, and organic material configured to detect electromagnetic radiation having one or more wavelengths. The detected electromagnetic radiation may have the same or different wavelengths as the emitted electromagnetic radiation. In some embodiments, photodetectors 422 may be provided at more than one of the locations 422-1, 422-2, 422-3, and may be configured to detect different wavelengths of electromagnetic radiation (and/or may be configured for different functional purposes, such as touch sensing, health sensing, or OLED health sensing). In some cases, the photodetectors 422 may be constructed as OPDs.

Examples of how OPDs (or other types of photodetectors) may be incorporated into the stack 400, or into other stacks, are illustrated with reference to FIGS. 5-9.

Figure 5:
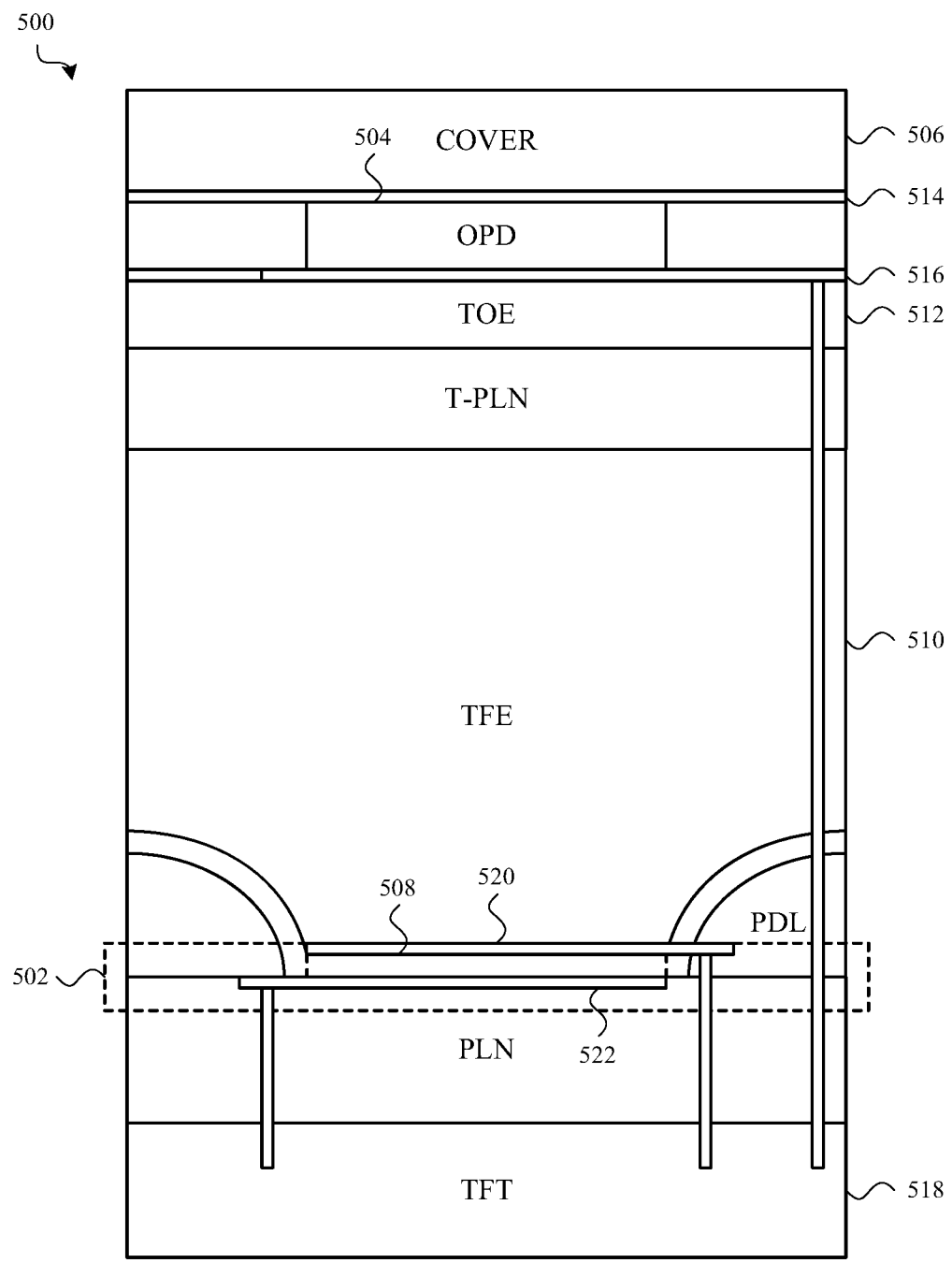
FIGS. 5, 6A-6C, 7, 8A-8B, 9, and 10A-10C show elevations of portions of example stacks including an OLED (or array of OLEDs) and an OPD (or array of OPDs)

FIG. 5 shows a portion of a first example stack 500 including an OLED 502 and an OPD 504. The OPD 504 is an example of a photodetector positioned at location 422-1 in FIG. 4. In some embodiments, the OLED 502 may be replaced by another type of light-emitting element, or the OPD 504 may be replaced by another type of photodetector.

In the stack 500, the OPD 504 is disposed between a device cover 506 (or other exterior structural component) and an emissive EL region 508 of the OLED 502, and may fully or partially overlap the emissive EL region 508. In alternative embodiments, the OPD 504 may have a greater width or depth, and may be positioned between the cover 506 and emissive EL regions 508 of multiple (i.e., two or more) OLEDs 502. The emissive EL region(s) 508 over which the OPD 504 is positioned may emit electromagnetic radiation through the OPD 504.

The stack 500 may be representative of a stack including an array of OLEDs 502. The stack 500 may also include an array of OPDs 504, which may have a one-to-one, one-to-many, or many-to-one correspondence with the OLEDs 502. The OPDs 504 may be disposed uniformly or non-uniformly over the OLEDs 502. For example, in some embodiments, an array of OPDs 504 may include OPDs 504 positioned over some or all of the OLEDs 502 in a particular region (or regions) of a display.

One or more intermediate layers or components, such as an OLED encapsulation layer 510 and/or touch sensor 512, may be positioned between the OLED 502 and OPD 504. Similarly, the one or more intermediate layers or components may be positioned between an array of such OLEDs 502 and one or an array of such OPDs 504. The OLED encapsulation layer 510 and touch sensor 512 are examples of the TFE layer and touch sensor described with reference to FIG. 4. Other layers, such as a T-PLN layer, may also be disposed between the OLED 502 (or array of OLEDs 502) and the OPD 504 (or array of OPDs 504).

In some embodiments of the stack 500, a first electrode 514 may be electrically connected to a first surface of the OPD 504 (e.g., a surface of the OPD 504 closest to the cover 506), and a second electrode 516 may be electrically connected to a second surface of the OPD 504 (e.g., a surface of the OPD 504 closest to the OLED 502). One or both of the electrodes 514, 516 may be electrically connected to a backplane (e.g., a TFT backplane 518) of the stack 500. In some embodiments, the second electrode 516 may be positioned between the OPD 504 and a touch sensor 512, and may be electrically connected to both the second surface of the OPD 504 and the touch sensor 512.

In some embodiments, a third electrode 520 may be electrically connected to a first surface of the OLED 502 (e.g., a surface of the OLED 502 closest to the OPD 504), and a fourth electrode 522 may be electrically connected to a second surface of the OLED 502 (e.g., a surface of the OLED 502 closest to the TFT backplane 518). One or both of the electrodes 520, 522 may be electrically connected to a backplane of the stack 500 (e.g., to the TFT backplane 518).

Each of the first, second, and third electrodes 514, 516, 520 may be semi-transparent or fully transparent, to allow electromagnetic radiation emitted by the OLED 502 to pass through the electrodes 514, 516, 520. The OPD 504 may also be constructed of semi-transparent or transparent materials.

Figure 6A:
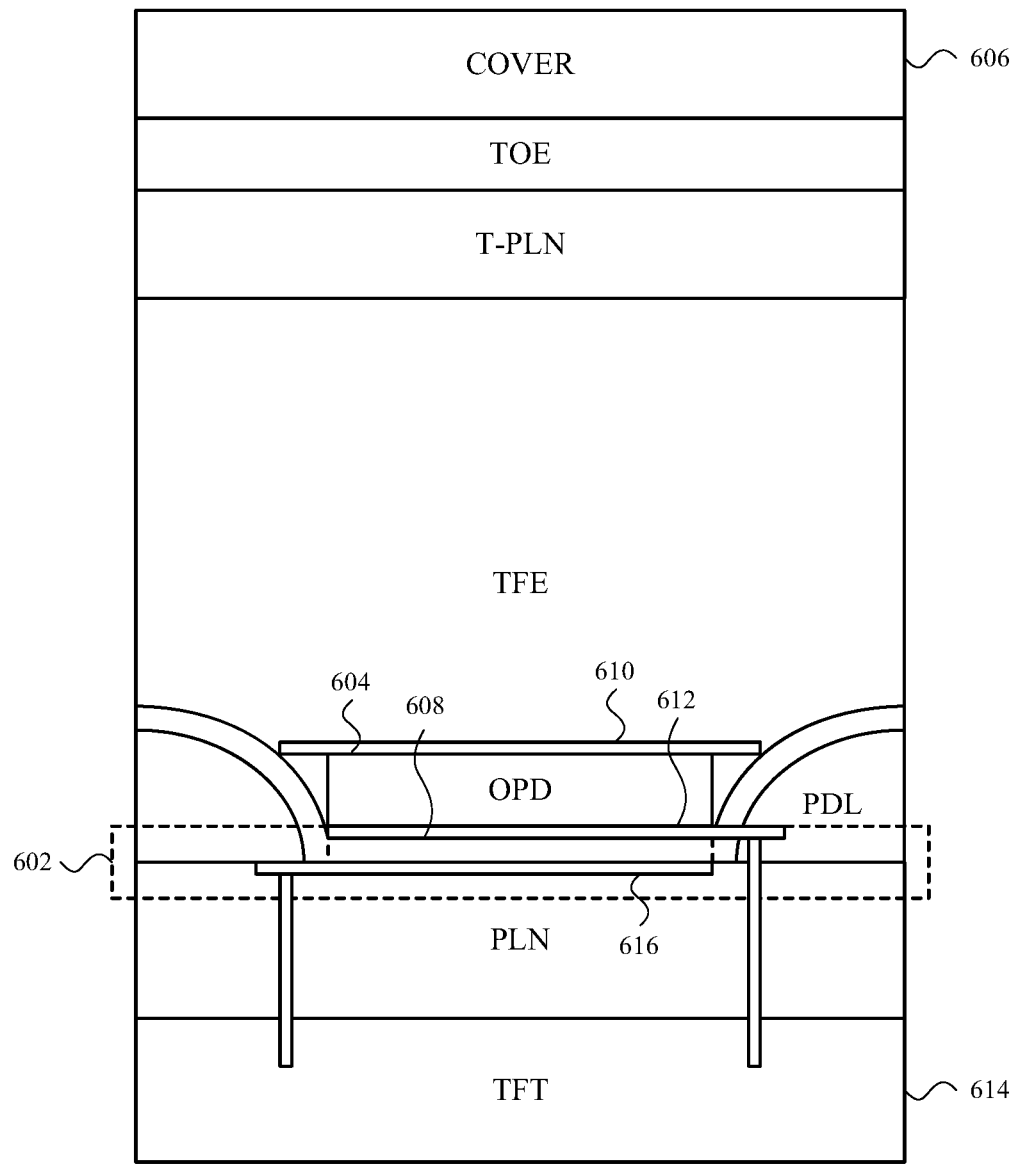

FIG. 6A shows a portion of a second example stack 600 including an OLED 602 and an OPD 604. The OPD 604 is an example of a photodetector positioned at location 422-2 in FIG. 4. In some embodiments, the OLED 602 may be replaced by another type of light-emitting element, or the OPD 604 may be replaced by another type of photodetector.

Similarly to the OPD described with reference to FIG. 5, the OPD 604 is disposed between a device cover 606 (or other exterior structural component) and an emissive EL region 608 of the OLED 602, and may fully or partially overlap the emissive EL region 608. In alternative embodiments, the OPD 604 may have a greater width or depth, and may be positioned between the cover 606 and emissive EL regions 608 of multiple (i.e., two or more) OLEDs 602. The emissive EL region(s) 608 over which the OPD 604 is positioned may emit electromagnetic radiation through the OPD 604.

The stack 600 may be representative of a stack including an array of OLEDs 602. The stack 600 may also include an array of OPDs 604, which may have a one-to-one, one-to-many, or many-to-one correspondence with the OLEDs 602. The OPDs 604 may be disposed uniformly or non-uniformly over the OLEDs 602. For example, in some embodiments, an array of OPDs 604 may include OPDs 604 positioned over some or all of the OLEDs 602 in a particular region (or regions) of a display.

In contrast to the stack described with reference to FIG. 5, the stack 600 may include fewer layers between the OLED 602 and OPD 604. In some cases, there may only be an electrode 612 between the OLED 602 and OPD 604. In some embodiments of the stack 600, a first electrode 610 may be electrically connected to a first surface of the OPD 604 (e.g., a surface of the OPD 604 closest to the cover 606), and a second electrode 612 may be electrically connected to a second surface of the OPD 604 (e.g., a surface of the OPD 604 closest to the OLED 602). One or both of the electrodes 610, 612 may be electrically connected to a backplane (e.g., a TFT backplane 614) of the stack 600. In some embodiments, the second electrode 612 may be positioned between the OPD 604 and the emissive EL region 608 of the OLED 602, and may be electrically connected to both the second surface of the OPD 604 and the emissive EL region 608 of the OLED 602.

In some embodiments, a third electrode 616 may be electrically connected to a surface of the OLED 602 opposite the OPD 604. The third electrode 616 may also be electrically connected to a backplane of the stack 600 (e.g., to the TFT backplane 614).

The first and second electrodes 610, 612 may be semi-transparent or fully transparent, to allow electromagnetic radiation emitted by the OLED 602 to pass through the electrodes 610, 612. The OPD 604 may also be constructed of semi-transparent or transparent materials.

Figure 6B:
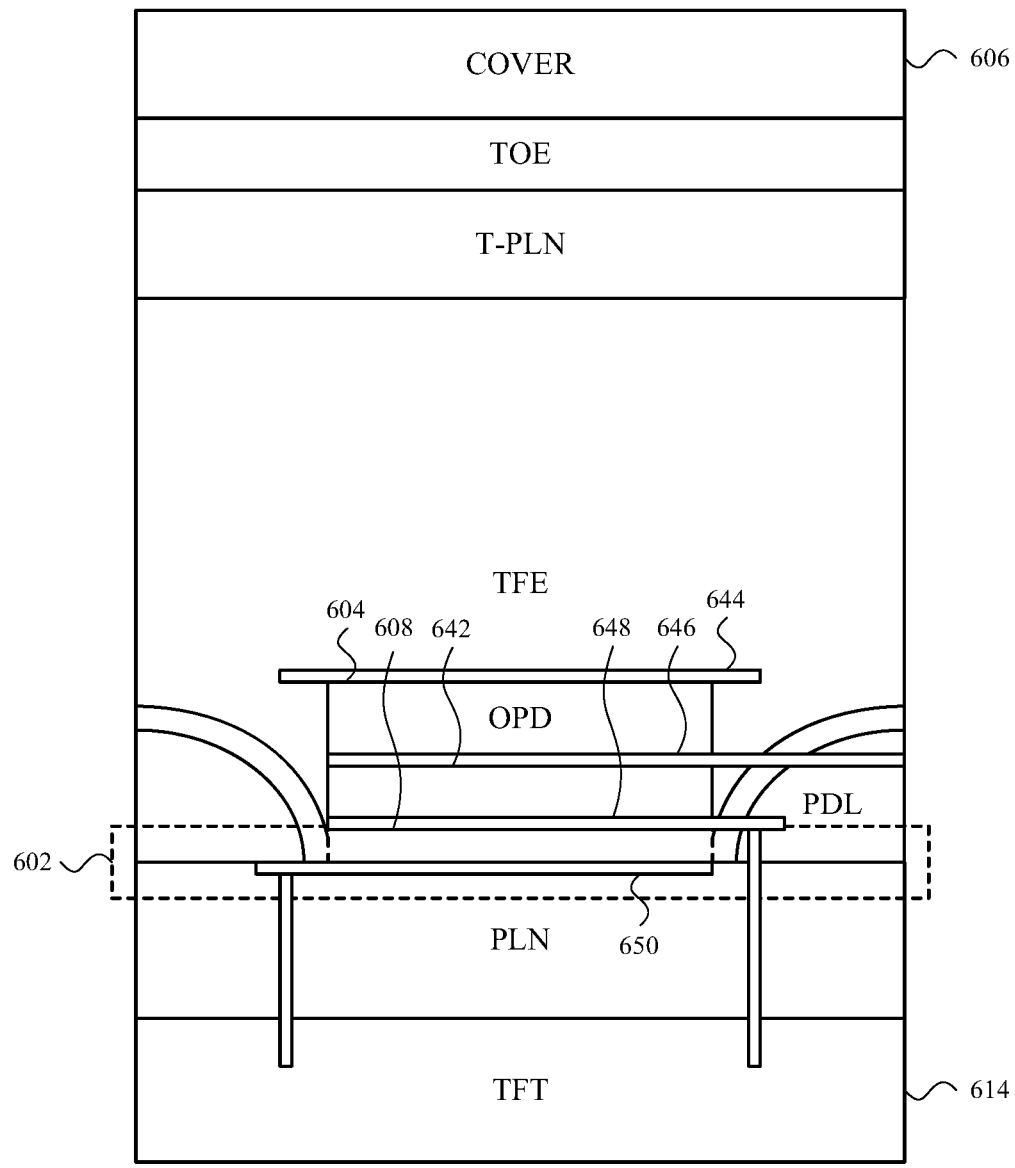

FIG. 6B shows a variation of the example stack 600 described with reference to FIG. 6A. The stack 640 differs from the stack 600 in that an additional one or more layers 642 are included between the OLED 602 and OPD 604. In some embodiments, the additional one or more layers may include one or more of a spacer or planarization layer, a layer that blocks a range of electromagnetic radiation wavelengths detected by the OPD 604 but not intended for the OLED 602, a lens (or lens array), and so on. Given the additional separation between the OLED 602 and the OPD 604, the OPD 604 may be coupled to a set of electrodes 644, 646 that is mutually exclusive of a set of electrodes 648, 650 coupled to the OLED 602.

Figure 6C:
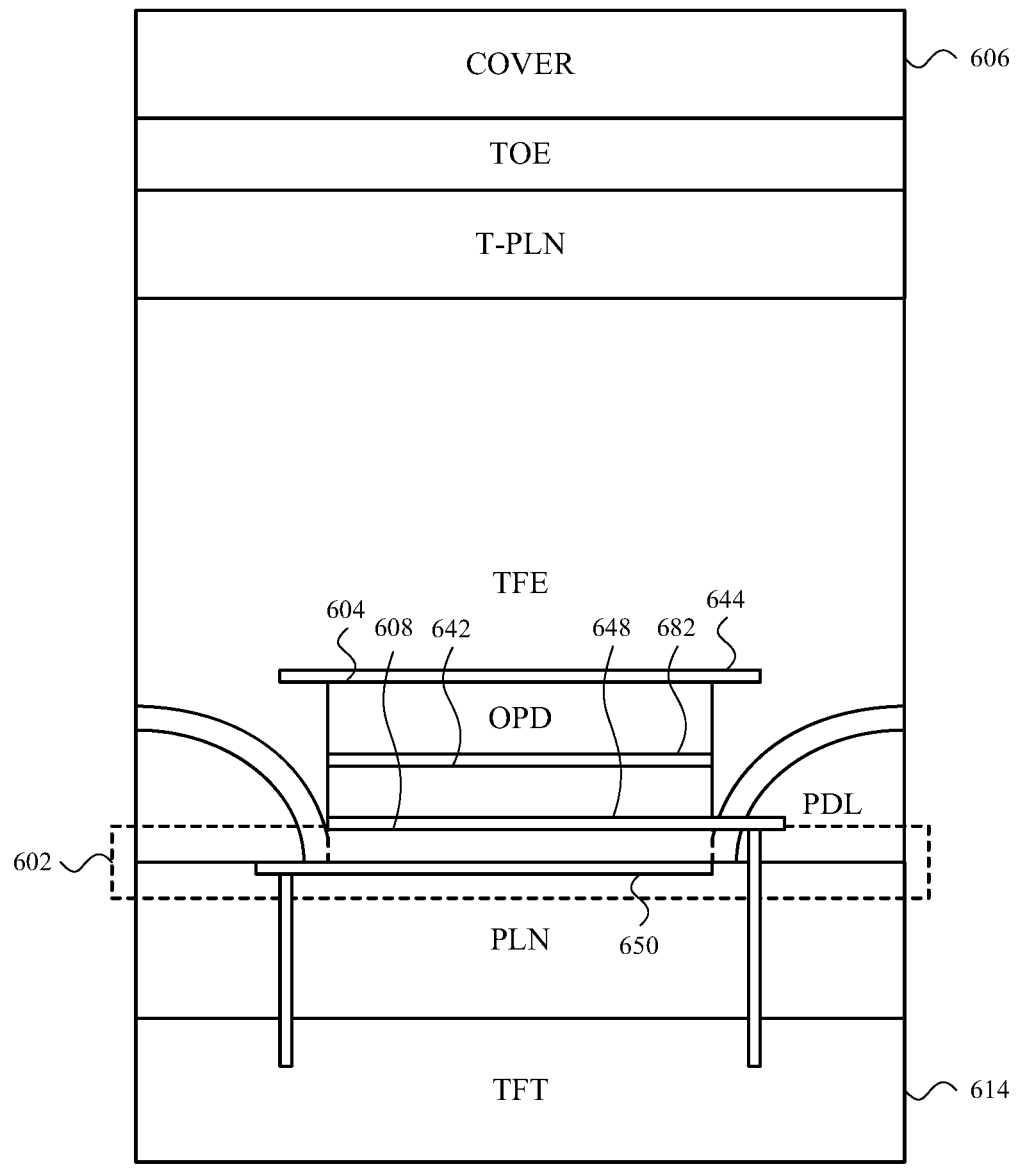

FIG. 6C shows another variation of the example stack 600 described with reference to FIG. 6A. The stack 680 differs from the stack 600 in that the second electrode 612 is replaced by a charge generation layer (CGL) 682. The CGL 682 may be used to discharge the OPD 604 and charge the emissive EL region 608. In some embodiments, the CGL 682 may include metal, such as silver (Ag), gold (Au), lithium (Li), ytterbium (Yb), and/or caesium (Cs). In other embodiments, the CGL 682 may be an all-organic interlayer. In some embodiments, one of the OLED 602 or OPD 604 may have an n-type active layer (or organic material), and the other of the OLED 602 or OPD 604 may have a p-type active layer (or organic material).

Figure 7:
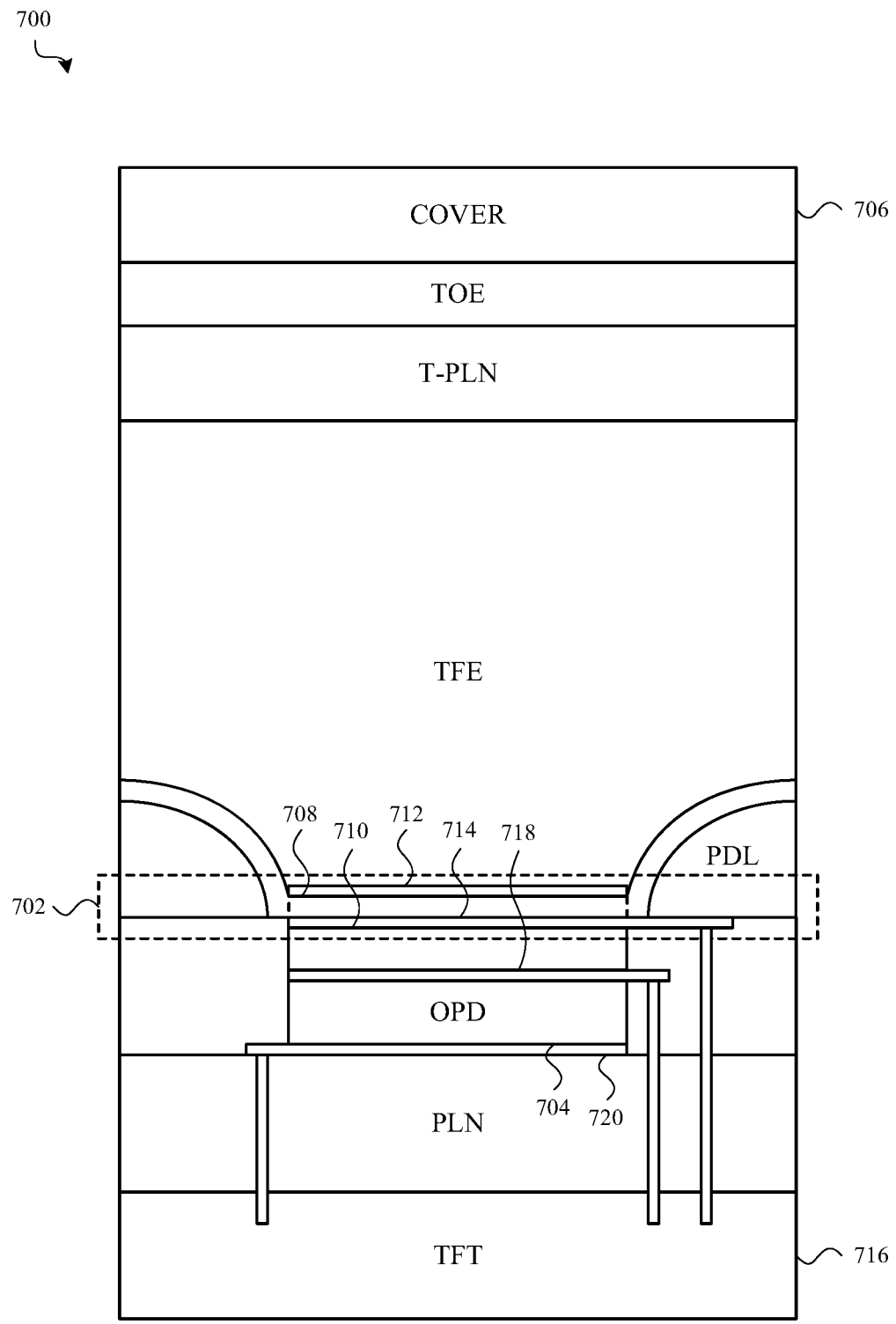

FIG. 7 shows a portion of a third example stack 700 including an OLED 702 and an OPD 704. The OPD 704 is an example of a photodetector positioned at location 422-3 in FIG. 4. In some embodiments, the OLED 702 may be replaced by another type of light-emitting element, or the OPD 704 may be replaced by another type of photodetector.

In the stack 700, the OLED 702 is disposed below a cover 706 (or other exterior structural component), and the OPD 704 is disposed below the OLED 702 (i.e., the OLED 702 is positioned between the OPD 704 and the cover 706). In some cases, and as shown, the OPD 704 may be positioned under an emissive EL region 708 of the OLED 702, and may fully or partially overlap the emissive EL region 708. In alternative embodiments, the OPD 704 may have a greater width or depth, and may extend under emissive EL regions 708 of multiple (i.e., two or more) OLEDs 702.

The stack 700 may be representative of a stack including an array of OLEDs 702. The stack 700 may also include an array of OPDs 704, which may have a one-to-one, one-to-many, or many-to-one correspondence with the OLEDs 702. The OPDs 704 may be disposed uniformly or non-uniformly over the OLEDs 702. For example, in some embodiments, an array of OPDs 704 may include OPDs 704 positioned below some or all of the OLEDs 702 in a particular region (or regions) of a display.

One or more intermediate layers or components 710, such as a reflector (e.g., a distributed Bragg reflector (DBR)), collimator, optical passband filter (e.g., color filter), or microlens may be positioned between the OLED 702 and OPD 704. Similarly, the one or more intermediate layers or components 710 may be positioned between an array of such OLEDs 702 and one or an array of such OPDs 704. When the one or more intermediate layers or components 710 include a reflector, such as a DBR, the reflector may be configured to reflect at least a first portion of a first range of electromagnetic radiation wavelengths emitted by the OLED 702, and to pass at least a second portion of a second range of wavelengths sensed by the OPD 704. In some embodiments, the first range of electromagnetic radiation wavelengths may be a visible range, and the second range may be a NIR range. In some embodiments, the first range includes a range of colored light (e.g., green light), and the second range may include a different range of colored light (e.g., red light). In some embodiments, the ranges of electromagnetic radiation wavelengths included in the first and second ranges may differ from pixel to pixel of a display. In some embodiments, the first and second ranges may be the same range or partially or fully overlapping ranges. For example, the OLED 702 and OPD 704 may be configured to sense the same or overlapping ranges of electromagnetic radiation.

When the one or more intermediate layers or components 710 include a collimator, the collimator may narrow the field of view of the OPD 704, to limit the angular optical acceptance cone of the OPD 704. When the one or more intermediate layers or components 710 include a microlens, the microlens may concentrate electromagnetic radiation on the OPD 704.

In some embodiments of the stack 700, the OPD 704 may have a material construction that configures the OPD 704 to absorb electromagnetic radiation in at least a first range of electromagnetic radiation wavelengths. The first range of electromagnetic radiation wavelengths may be outside a second range of electromagnetic radiation wavelengths emitted by the OLED 702. In some embodiments, the material construction of the OPD 704 may be further configured to not absorb electromagnetic radiation in at least the second range of electromagnetic radiation wavelengths. Alternatively or additionally, a material positioned between the OLED 702 and the OPD 704 (e.g., a layer or component 710) may be configured to reflect or absorb the second range of electromagnetic radiation wavelengths. The first and second ranges of electromagnetic radiation wavelengths may be non-overlapping.

In some embodiments of the stack 700, a first electrode 712 may be electrically connected to a first surface of the OLED 702 (e.g., to a surface of the emissive EL region 708 closest to the cover 706), and a second electrode 714 may be electrically connected to a second surface of the OLED 702 (e.g., to a surface of the emissive EL region 708 closest to the OPD 704). One or both of the electrodes 712, 714 may be electrically connected to a backplane (e.g., a TFT backplane 716) of the stack 700.

In some embodiments, a third electrode 718 may be electrically connected to a first surface of the OPD 704 (e.g., a surface of the OPD 704 that is closest to the OLED 702), and a second electrode 720 may be electrically connected to a second surface of the OPD 704 (e.g., a surface of the OPD 704 that is closest to the TFT backplane 716). One or both of the electrodes 718, 720 may be electrically connected to a backplane of the stack 700 (e.g., to the TFT backplane 716).

Each of the first, second, and third electrodes 712, 714, 718 may be semi-transparent or fully transparent, to allow at least a portion of the electromagnetic radiation emitted by the OLED 702 to pass through the electrodes 712, 714, 718. When the OPD 704 is measuring light received through the cover 706, the OLED 702 may also be constructed of semi-transparent or transparent materials.

Figure 8A:
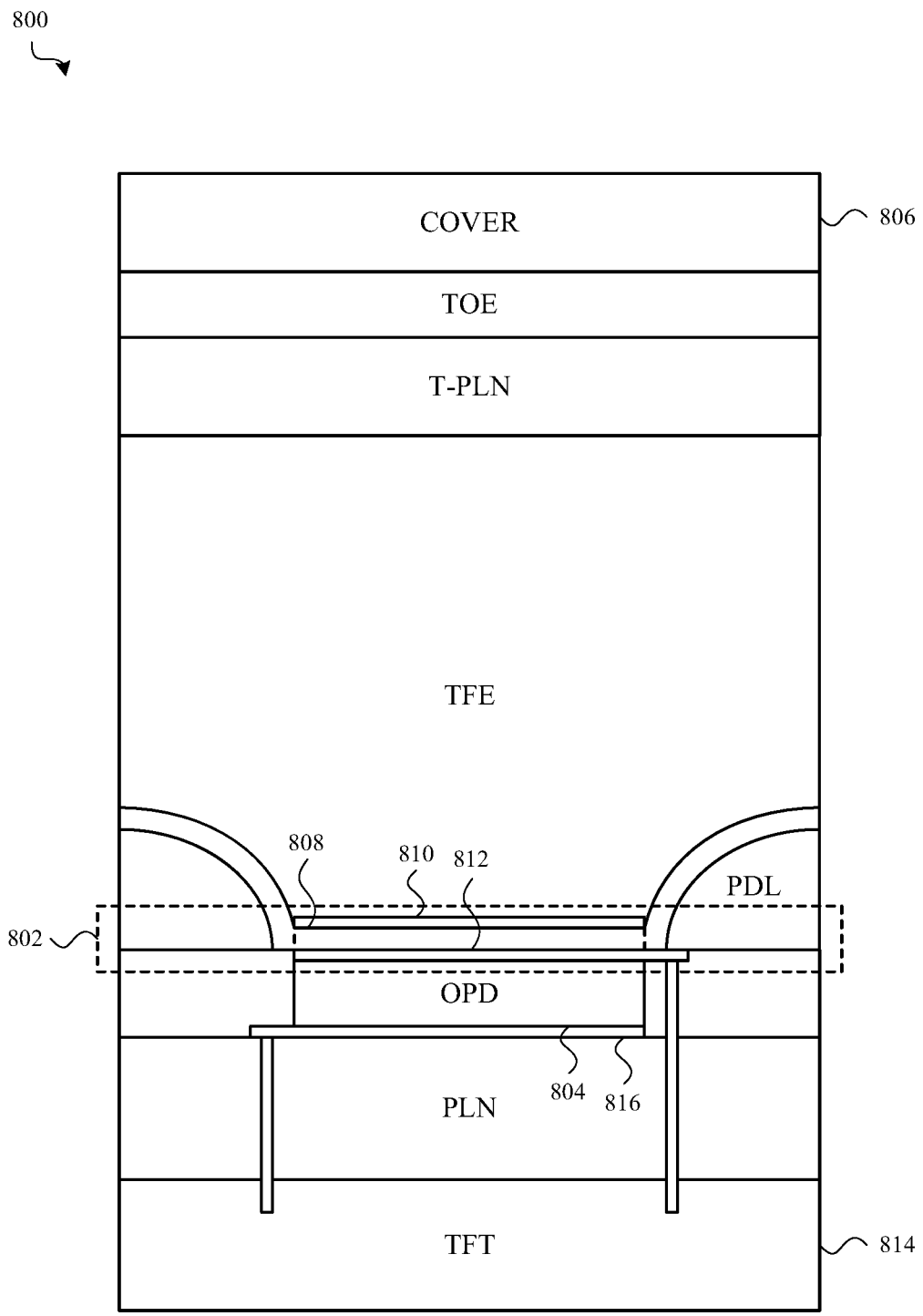

FIG. 8A shows a portion of a fourth example stack 800 including an OLED 802 and an OPD 804. The OPD 804 is an example of a photodetector positioned at location 422-3 in FIG. 4. In some embodiments, the OLED 802 may be replaced by another type of light-emitting element, or the OPD 804 may be replaced by another type of photodetector.

Similarly to the OLED and OPD described with reference to FIG. 7, the OLED 802 is disposed below a cover 806 (or other exterior structural component), and the OPD 804 is disposed below the OLED 802 (i.e., the OLED 802 is positioned between the OPD 804 and the cover 806). In some cases, and as shown, the OPD 804 may be positioned under an emissive EL region 808 of the OLED 802, and may fully or partially overlap the emissive EL region 808. In alternative embodiments, the OPD 804 may have a greater width or depth, and may extend under emissive EL regions 808 of multiple (i.e., two or more) OLEDs 802.

The stack 800 may be representative of a stack including an array of OLEDs 802. The stack 800 may also include an array of OPDs 804, which may have a one-to-one, one-to-many, or many-to-one correspondence with the OLEDs 802. The OPDs 804 may be disposed uniformly or non-uniformly over the OLEDs 802. For example, in some embodiments, an array of OPDs 804 may include OPDs 804 positioned below some or all of the OLEDs 802 in a particular region (or regions) of a display.

In contrast to the stack described with reference to FIG. 7, the stack 800 may include fewer layers between the OLED 802 and OPD 804. In some cases, there may only be an electrode 812 between the OLED 802 and OPD 804. In some embodiments of the stack 800, a first electrode 810 may be electrically connected to a first surface of the OLED 802 (e.g., to a surface of the emissive EL region 808 closest to the cover 806), and a second electrode 812 may be electrically connected to a second surface of the OLED 802 (e.g., to a surface of the emissive EL region 808 closest to the OPD 804). One or both of the electrodes 810, 812 may be electrically connected to a backplane (e.g., a TFT backplane 814) of the stack 800. In some embodiments, the second electrode 812 may be electrically connected to both the emissive EL region 808 and a first surface of the OPD 804.

In some embodiments, a third electrode 816 may be electrically connected to a second surface of the OPD 804 (e.g., to a surface of the OPD 804 that is closest to the TFT backplane 814). The third electrode 816 may also be electrically connected to a backplane of the stack 800 (e.g., to the TFT backplane 814).

Each of the first and second electrodes 810, 812 may be semi-transparent or fully transparent, to allow at least a portion of the electromagnetic radiation emitted by the OLED 802 to pass through the electrodes 810, 812. When the OPD 804 is measuring light received through the cover 806, the OLED 802 may also be constructed of semi-transparent or transparent materials.

Figure 8B:
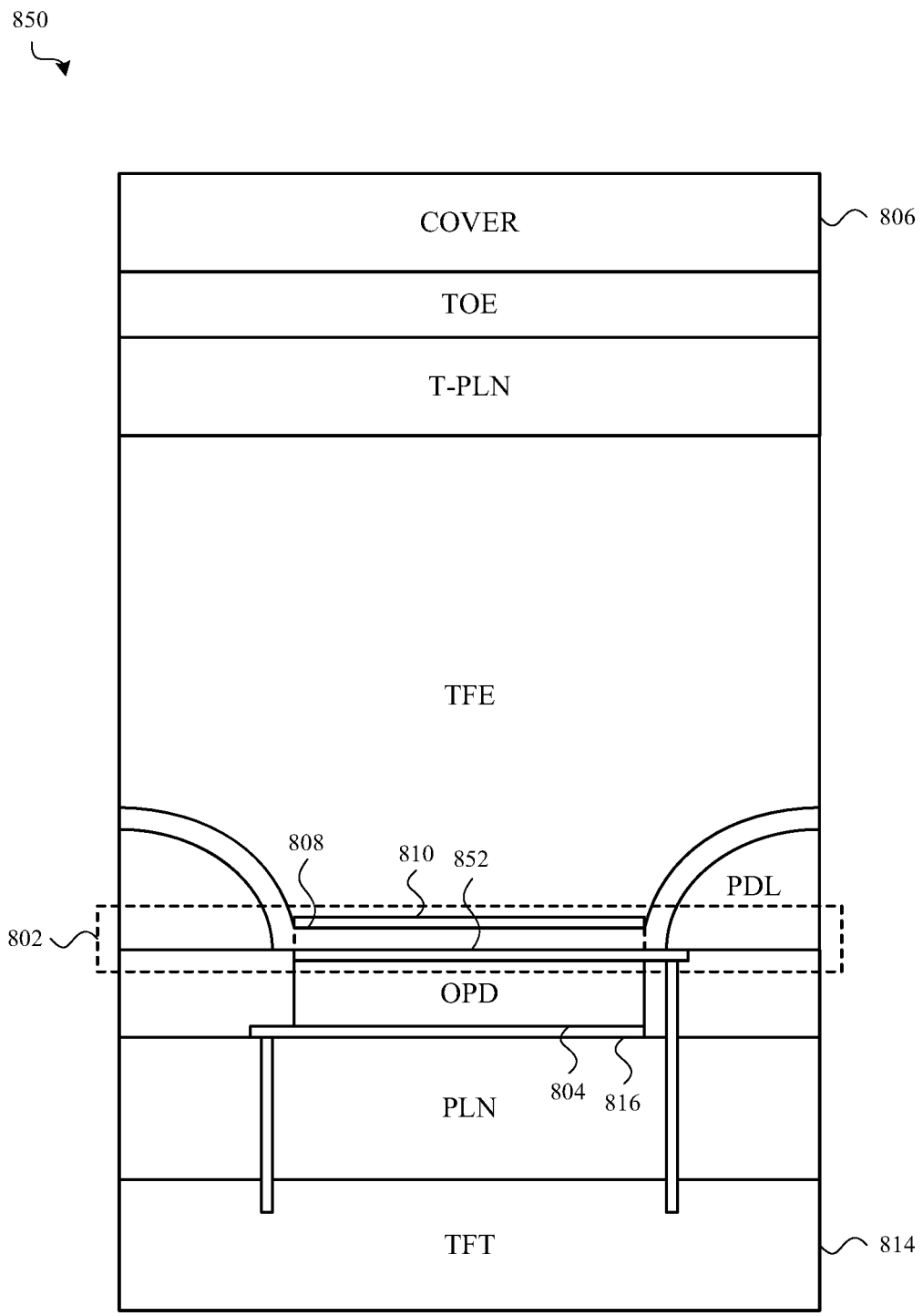

FIG. 8B shows a variation of the example stack 800 described with reference to FIG. 8A. The stack 850 differs from the stack 800 in that the second electrode 812 is replaced by a CGL 852. The CGL 852 may be used to discharge the OPD 804 and charge the emissive EL region 808. In some embodiments, the CGL 852 may include metal, such as Ag, Au, Li, Yb, and/or Cs. In other embodiments, the CGL 852 may be an all-organic interlayer. In some embodiments, one of the OLED 802 or OPD 804 may have an n-type active layer (or organic material), and the other of the OLED 802 or OPD 804 may have a p-type active layer (or organic material).

Figure 9:
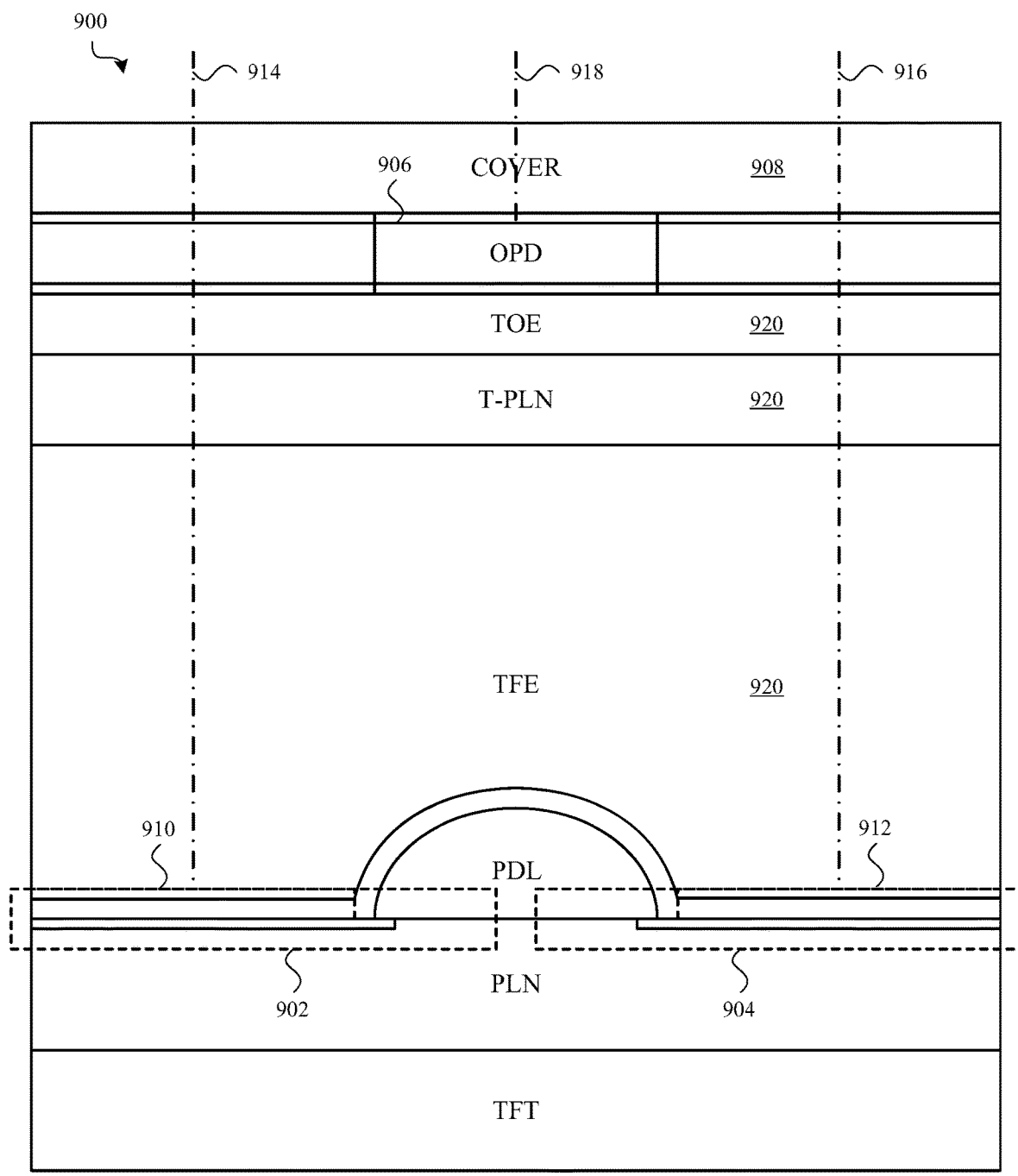

FIG. 9 shows a portion of a fifth example stack 900 including an array of OLEDs 902, 904 and at least one OPD 906. The at least one OPD 906 is an example of a photodetector positioned at location 422-1 in FIG. 4. In some embodiments, the OLEDs 902, 904 may be replaced by another type of light-emitting element, or the at least one OPD 906 may be replaced by another type of photodetector.

In the stack 900, the at least one OPD 906 is disposed between a device cover 908 (or other exterior structural component) and the array of OLEDs 902, 904, but emissive EL regions 910, 912 of the OLEDs 902, 904 are offset horizontally as well as vertically with respect to the at least one OPD 906, with the emissive EL regions 910, 912 and OPD(s) 906 including respective organic materials in different layers. Stated differently, the array of emissive EL regions 910, 912 may have a first set of axes perpendicular to the cover 908 (e.g., emission axes 914, 916), and the at least one OPD 906 may have a second set of axes (e.g., detection axis 918) perpendicular to the cover 908, and axes of the OPDs 906 may be interspersed with (i.e., not coincident with) the axes of the emissive EL regions 910, 912.

The stack 900 may be representative of a stack including an array of OLEDs 902, 904 and an array of OPDs 906, which may be provided in equal or different numbers. The OPDs 906 may be interspersed uniformly or non-uniformly with the OLEDs 902, 904. For example, in some embodiments, an array of OPDs 906 may include OPDs 906 interspersed with the OLEDs 902, 904 in a particular region (or regions) of a display.

Because they are provided in separate layers, the at least one OPD 906 and array of OLEDs 902, 904 may have separate hole and electron transport layers. In some cases, the at least one OPD 906 and array of OLEDs 902, 904 may be fabricated by solution processing, with techniques such as ink jet printing. One or more intermediate layers or components 920 may be positioned between the OLEDs 902, 904 and OPD 906 as described with reference to FIG. 5. Electrodes may also be disposed in the stack 900 and electrically connected to the OLEDs 902, 904 and OPD 906, as described, for example, with reference to FIG. 5.

In a variation of the stack 900, the at least one OPD 906 may be moved closer to the array of OLEDs 902, 904, similarly to what is described with reference to FIG. 6A, but with the emissive EL regions 910, 912 and OPDs 906 both horizontally and vertically offset.

Figure 10A:
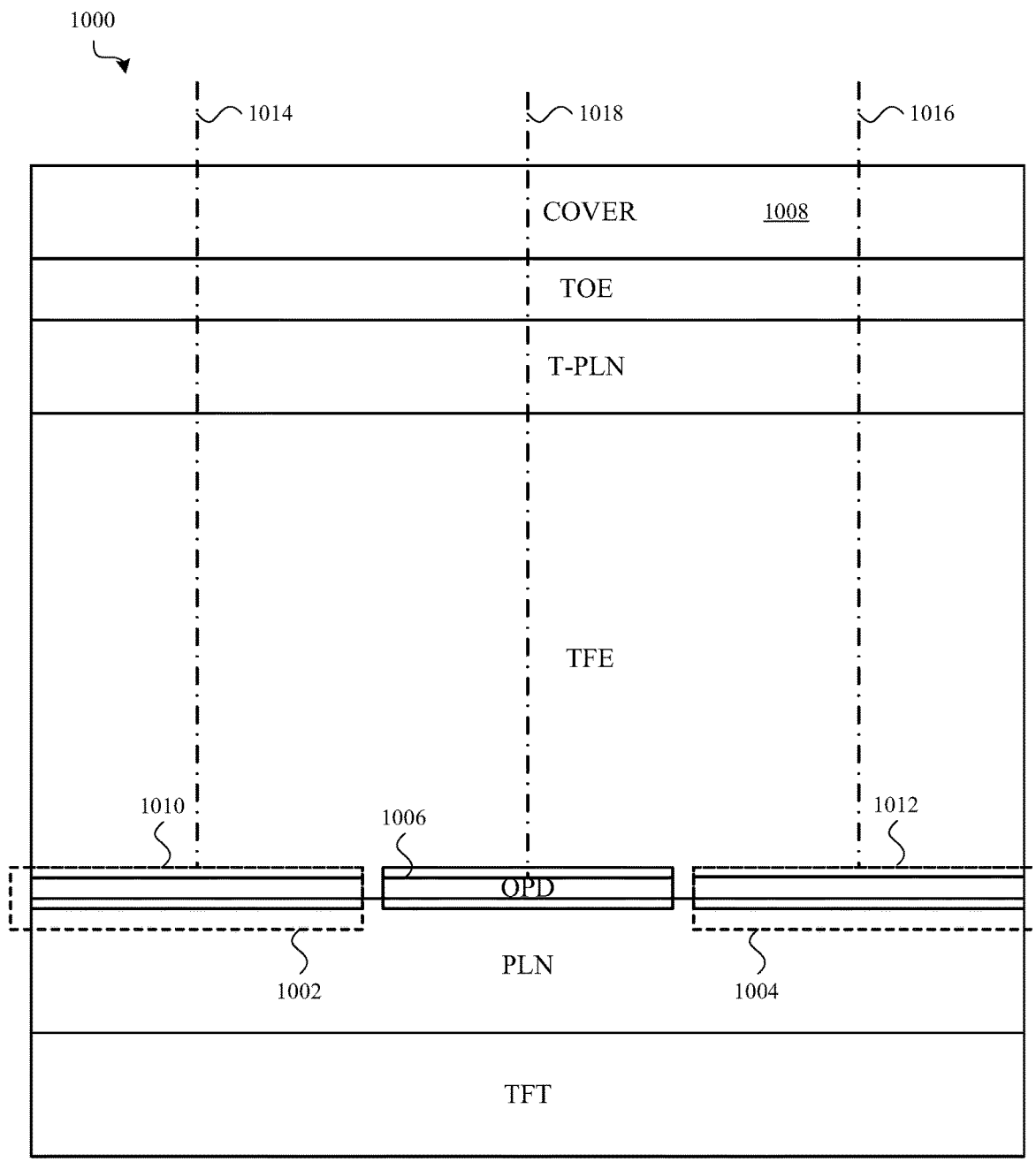

FIG. 10A shows a portion of a sixth example stack 1000 including an array of OLEDs 1002, 1004 and at least one OPD 1006. The at least one OPD 1006 is an example of a photodetector positioned adjacent emissive EL regions in the organic material 408 described with reference to FIG. 4. In some embodiments, the OLEDs 1002, 1004 may be replaced by another type of light-emitting element, or the at least one OPD 1006 may be replaced by another type of photodetector.

In the stack 1000, the OLEDs 1002, 1004 and at least one OPD 1006 are disposed under a device cover 1008 (or other exterior structural component). The array of OLEDs 1002, 1004 includes an array of emissive EL regions 1010, 1012, as described with reference to FIG. 9, and the emissive EL regions 1010, 1012 are offset horizontally with respect to the at least one OPD 1006, with the emissive EL regions 1010, 1012 and OPD(s) 1006 including respective organic materials in the same layer. Stated differently, the array of emissive EL regions 1010, 1012 may have a first set of axes perpendicular to the cover 1008 (e.g., emission axes 1014, 1016), and the at least one OPD 1006 may have a second set of axes (e.g., detection axis 1018) perpendicular to the cover 1008, and axes of the OPDs 1006 may be interspersed with (i.e., not coincident with) the axes of the emissive EL regions 1010, 1012. The OPD(s) 1006 may replace portions or all of a PDL layer.

The stack 1000 may be representative of a stack including an array of OLEDs 1002, 1004 and an array of OPDs 1006, which may be provided in equal or different numbers. The OPDs 1006 may be interspersed uniformly or non-uniformly with the OLEDs 1002, 1004. For example, in some embodiments, an array of OPDs 1006 may include OPDs 1006 interspersed with the OLEDs 1002, 1004 in a particular region (or regions) of a display.

The at least one OPD 1006 may have an active layer that includes a mixture of materials (e.g., a bulk heterojunction), a few layers or material that form one or more heterojunctions, or a single layer of material. The at least one OPD 1006 may share the hole and electron transport layers of the array of OLEDs 1002, 1004, thereby reducing the number of fine metal masks needed to produce the stack 1000. In some cases, the at least one OPD 1006 and array of OLEDs 1002, 1004 may be fabricated by solution processing, with techniques such as ink jet printing. Electrodes may be electrically connected to the OLEDs 1002, 1004 and at least one OPD 1006 as described with reference to FIG. 6A, or in other ways.

Figure 10B:
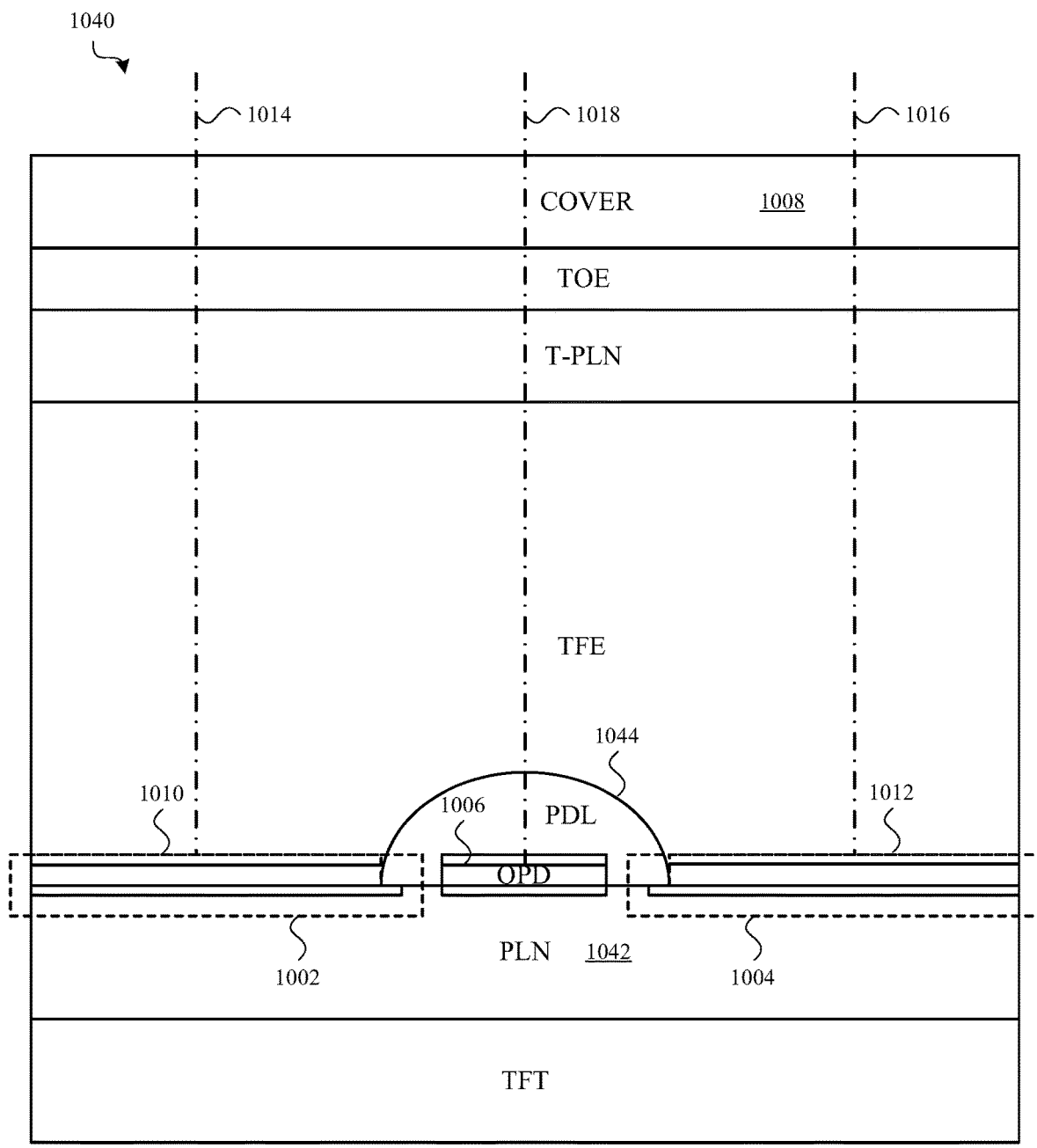

FIG. 10B shows a variation of the example stack 1000 described with reference to FIG. 10A. The stack 1040 differs from the stack 1000 in that the stack includes a PDL layer 1042 (e.g., a PDL layer similar to the PDL layer 406 described with reference to FIG. 4), and the OPD 1006 is positioned under (or within) the PDL layer 1042 (or between the PDL layer 1042 and another layer, such as a PLN layer 1044).

Figure 10C:
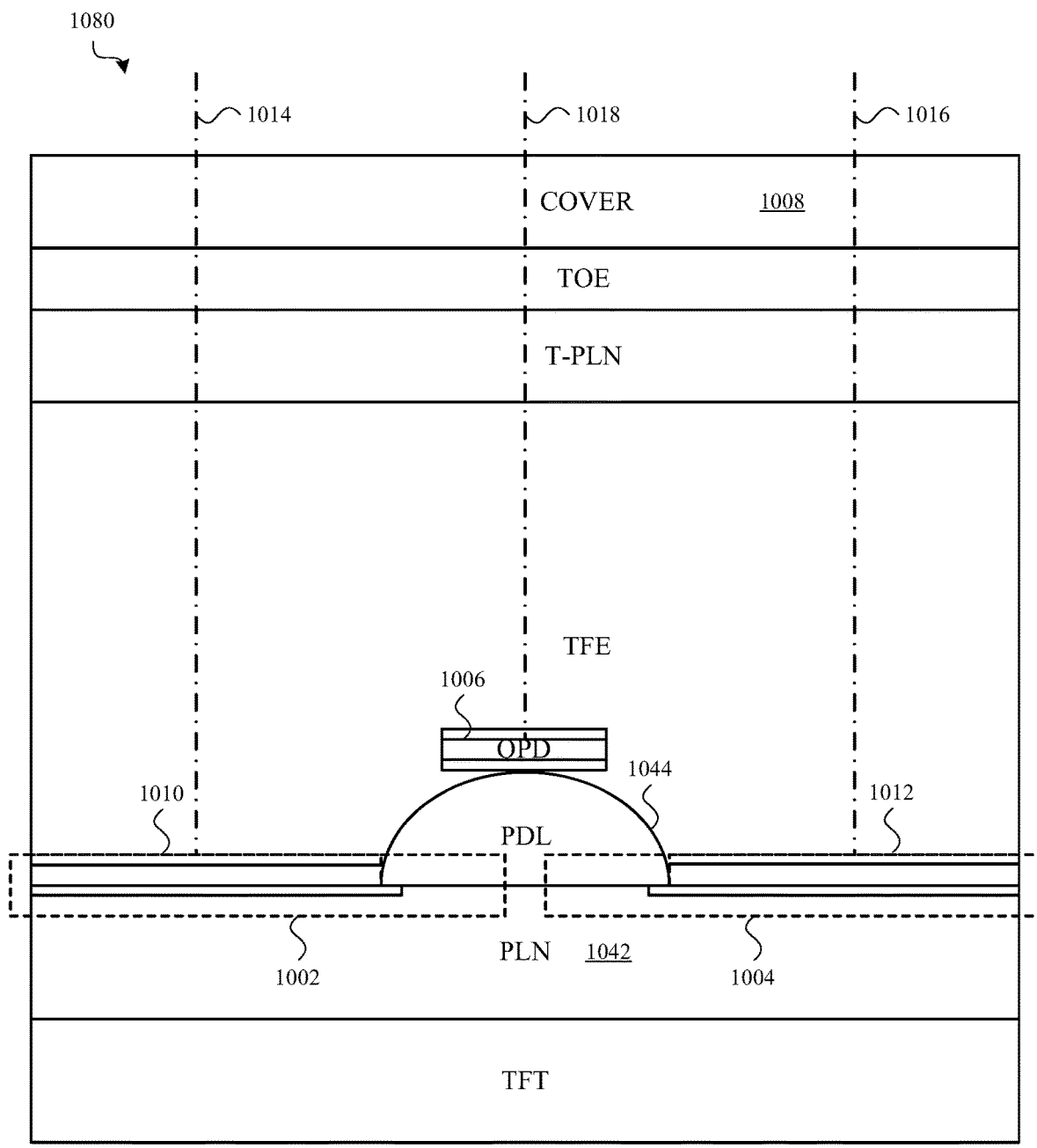

FIG. 10C shows a variation of the example stack 1040 described with reference to FIG. 10B. The stack 1080 differs from the stack 1040 in that the OPD 1006 is positioned on (and above) the PDL layer 1042. Similarly to what is described with reference to FIG. 9, the stack 1080 both horizontally and vertically offsets the emissive EL regions 1010, 1012 with respect to the at least one OPD 1006. However, the OPD(s) 1006 may be positioned much closer to the emissive EL regions 1010, 1012 in the stack 1080.

Figure 11:
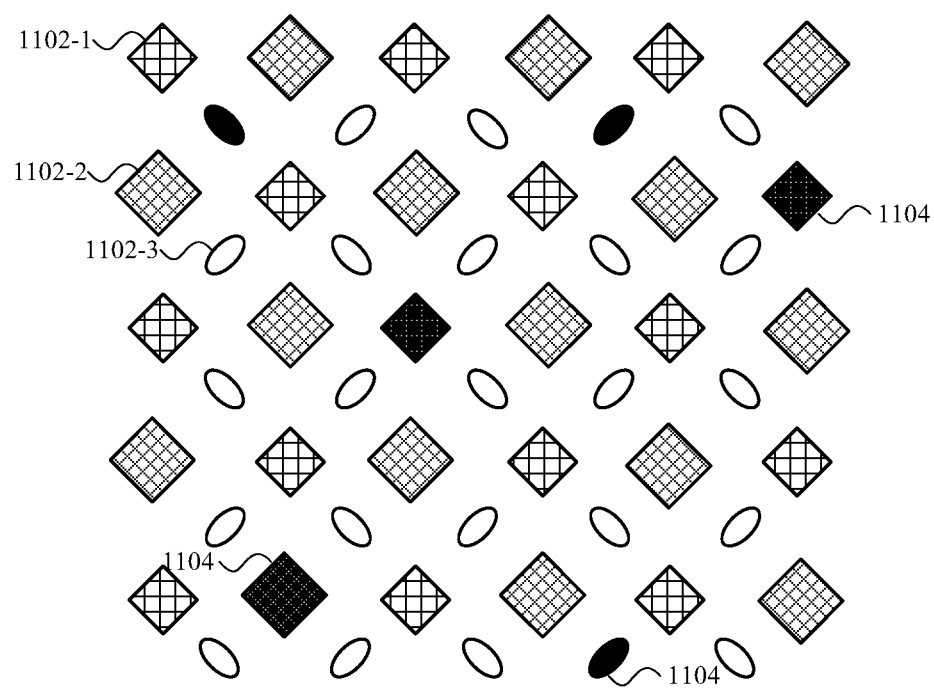
FIG. 11 shows an example plan view of the stack described with reference to FIG. 9, 10A, 10B, or 10C.

FIG. 11 shows an example plan view of the stack described with reference to FIG. 9 or 10. The stack includes an array of OLEDs 1102, including red OLEDs 1102-1, blue OLEDs 1102-2, and green OLEDs 1102-3. In some embodiments, and as shown, each of the red, blue, and green OLEDs 1102-1, 1102-2, 1102-3 may be more or less uniformly distributed with respect to the surface of the stack, and an array of OPDs 1104 may replace ones of the OLEDs 1102-1, 1102-2, 1102-3 in a uniform or non-uniform manner across the surface of the stack. Alternatively, one or more OPDs may be positioned at uniform or non-uniform locations, across the surface of the stack, without replacing any of the uniformly-distributed OLEDs 1102-1, 1102-2, 1102-3.

Any of the stacks described with reference to FIGS. 5-11 may be incorporated into an electronic device such as the device described with reference to FIG. 1A-1B or 2A-2B, or into other types or forms of devices. When controlled by a processor, an array of OLEDs (or other light-emitting elements) and array of OPDs (or other photodetectors, or at least one photodetector) may be activated alternately or contemporaneously. Alternate activation may be useful for reducing optical interference during ambient or externally-reflected electromagnetic radiation sensing. Contemporaneous activation may be useful for OLED health sensing.

In some embodiments, a processor may operate an array of OPDs (or at least one OPD) in different modes. For example, the processor may be configured to operate an array of OPDs (or at least one OPD) in an OLED emission measurement mode, in which the processor activates the array of OPDs contemporaneously with the array of OLEDs or, alternatively, in at least one of an ambient electromagnetic radiation sensing mode or a reflective sensing mode (e.g., an externally-reflected electromagnetic radiation sensing mode), in which the processor activates the array of OPDs and array of OLEDs at different times.

In some embodiments, a processor may activate different sub-arrays of OPDs for different purposes—either alternately or contemporaneously. For example, upon use of a first sub-array of OPDs to authenticate a user (e.g., by face recognition or a fingerprint match), the processor may activate a second sub-array (or the first sub-array) to sense a health condition (e.g., a user's heart rate).

In some embodiments, an array of OPDs may include different sub-arrays of OPDs that are configured to detect different wavelengths of electromagnetic radiation. For example, an array of OPDs may include a first sub-array of OPDs configured to detect a first range of electromagnetic radiation wavelengths, and a second sub-array of OPDs configured to detect a second range of electromagnetic radiation wavelengths, in which the first and second ranges of electromagnetic radiation wavelengths differ. The first and second sub-arrays of OPDs may be operated contemporaneously (e.g., when the first and second sub-arrays are used to sense different wavelengths of ambient light) or alternately (e.g., when the different sub-arrays are used for fingerprint sensing and OLED health sensing, respectively).

The transparent or semi-transparent electrodes described with reference to FIGS. 5-11, or any of the electrodes included in the stacks described with reference to FIGS. 5-11, may be formed, for example, using thin metal layers, transparent conductive oxides, conductive polymers, metal nanowires, and so on.

The active layer of the OPDs described with reference to FIGS. 5-11 may in some cases be deposited by vacuum or by solution, depending on the stack architecture and the deposition technique's compatibility with the stack's OLEDs. The active layer of the OPDs may include, for example, a mixture of materials (e.g., a bulk heterojunction), a few layers or material that form one or more heterojunctions, or a single layer of material. OPD transport properties may be optimized independent of OLED transport properties.

The active layer of the OLEDs described with reference to FIGS. 5-11 may in some cases be deposited by vacuum or by solution, depending on the stack architecture. In some cases, the OLEDs may be optimized at the expense of OPD optimization, or vice versa.

In any of the stacks described with reference to FIGS. 5-11, crosstalk between OLEDs and OPDs can be mitigated by absorption tuning of the OPDs or OLEDs (e.g., through material and/or cavity tuning, by insertion of a color filter, and/or, when appropriate, by insertion of other electromagnetic radiation-absorbing elements that can block electromagnetic radiation leakage from OLEDs that might interfere with an intended function (or functions) of the OPDs). When relevant, a DBR may also or alternatively be used between an OPD and an OLED. When an OPD is used to measure the health of an OLED, absorption of an OPD may be tuned to match the emission of the OLED positioned above or near the OPD. When an OPD is used to measure electromagnetic radiation other than that emitted by an OLED, the OPD absorption may be tuned to exclude the emission of the OLED and/or an intermediary layer or component (e.g., a DBR) may be tuned to reflect the OLED's emission.

Figure 12:
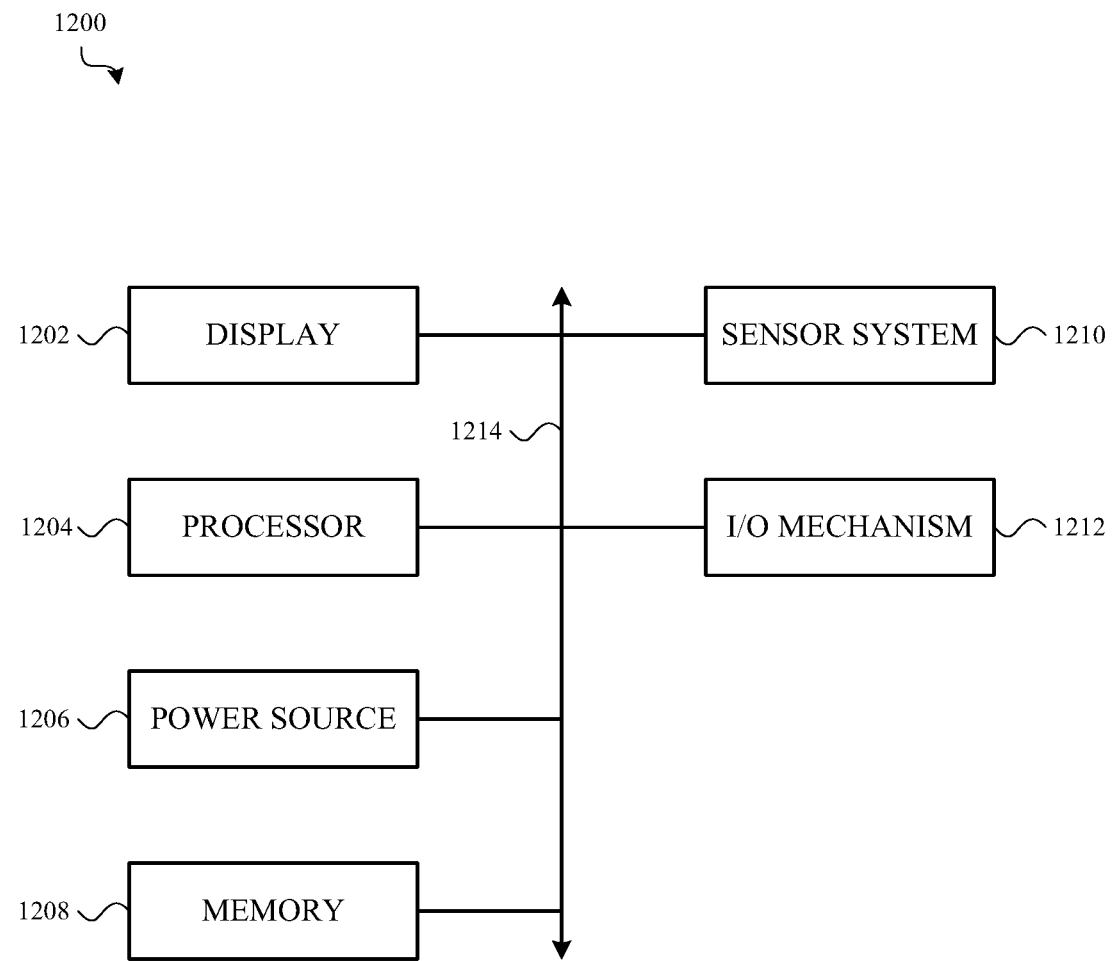
FIG. 12 shows a sample electrical block diagram of an electronic device, which electronic device may in some cases be implemented as the device described with reference to FIG. 1A-1B or 2A-2B.

FIG. 12 shows a sample electrical block diagram of an electronic device 1200, which electronic device may in some cases be implemented as the device described with reference to FIG. 1A-1B or 2A-2B. The electronic device 1200 may include an electronic display 1202 (e.g., a light-emitting display), a processor 1204, a power source 1206, a memory 1208 or storage device, a sensor system 1210, or an input/output (I/O) mechanism 1212 (e.g., an input/output device, input/output port, or haptic input/output interface). The processor 1204 may control some or all of the operations of the electronic device 1200. The processor 1204 may communicate, either directly or indirectly, with some or all of the other components of the electronic device 1200. For example, a system bus or other communication mechanism 1214 can provide communication between the electronic display 1202, the processor 1204, the power source 1206, the memory 1208, the sensor system 1210, and the I/O mechanism 1212.

The processor 1204 may be implemented as any electronic device capable of processing, receiving, or transmitting data or instructions, whether such data or instructions is in the form of software or firmware or otherwise encoded. For example, the processor 1204 may include a microprocessor, a central processing unit (CPU), an application-specific integrated circuit (ASIC), a digital signal processor (DSP), a controller, or a combination of such devices. As described herein, the term "processor" is meant to encompass a single processor or processing unit, multiple processors, multiple processing units, or other suitably configured computing element or elements. In some cases, the processor 1204 may be the processor described with reference to any of FIG. 1A-1B, 2A-2B, 3, or other figures.

It should be noted that the components of the electronic device 1200 can be controlled by multiple processors. For example, select components of the electronic device 1200 (e.g., the sensor system 1210) may be controlled by a first processor and other components of the electronic device 1200 (e.g., the electronic display 1202) may be controlled by a second processor, where the first and second processors may or may not be in communication with each other.

The power source 1206 can be implemented with any device capable of providing energy to the electronic device 1200. For example, the power source 1206 may include one or more batteries or rechargeable batteries. Additionally or alternatively, the power source 1206 may include a power connector or power cord that connects the electronic device 1200 to another power source, such as a wall outlet.

The memory 1208 may store electronic data that can be used by the electronic device 1200. For example, the memory 1208 may store electrical data or content such as, for example, audio and video files, documents and applications, device settings and user preferences, timing signals, control signals, and data structures or databases. The memory 1208 may include any type of memory. By way of example only, the memory 1208 may include random access memory, read-only memory, Flash memory, removable memory, other types of storage elements, or combinations of such memory types.

The electronic device 1200 may also include one or more sensor systems 1210 positioned almost anywhere on the electronic device 1200. In some cases, the sensor systems 1210 may include one or more photodetectors, positioned as described with reference to any of FIGS. 1A-11. The sensor system(s) 1210 may be configured to sense one or more types of parameters, such as but not limited to, vibration; light; touch; force; heat; movement; relative motion; biometric data (e.g., biological parameters) of a user; air quality; proximity; position; connectedness; matter type; and so on. By way of example, the sensor system(s) 1210 may include one or more of (or multiple of) a heat sensor, a position sensor, a proximity sensor, a light or optical sensor (e.g., an electromagnetic radiation emitter and/or detector), an accelerometer, a pressure transducer, a gyroscope, a magnetometer, a health monitoring sensor, and an air quality sensor, and so on. Additionally, the one or more sensor systems 1210 may utilize any suitable sensing technology, including, but not limited to, interferometric, magnetic, pressure, capacitive, ultrasonic, resistive, optical, acoustic, piezoelectric, or thermal technologies.

In some embodiments, the electronic display 1202 and one or more photodetectors of a sensor system 1210 may be incorporated into a stack (e.g., a device stack or display stack) as described with reference to any of FIGS. 1A-11.

The I/O mechanism 1212 may transmit or receive data from a user or another electronic device. The I/O mechanism 1212 may include the electronic display 1202, a touch sensing input surface, a crown, one or more buttons (e.g., a graphical user interface "home" button), one or more cameras (including an under-display camera), one or more microphones or speakers, one or more ports such as a microphone port, and/or a keyboard. Additionally or alternatively, the I/O mechanism 1212 may transmit electronic signals via a communications interface, such as a wireless, wired, and/or optical communications interface. Examples of wireless and wired communications interfaces include, but are not limited to, cellular and Wi-Fi communications interfaces.

The foregoing description, for purposes of explanation, uses specific nomenclature to provide a thorough understanding of the described embodiments. However, it will be apparent to one skilled in the art, after reading this description, that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art, after reading this description, that many modifications and variations are possible in view of the above teachings.

As described above, one aspect of the present technology may be the gathering and use of data available from various sources, including biometric data (e.g., the presence and/or proximity of a user to a device, a user's fingerprint, and so on). The present disclosure contemplates that, in some instances, this gathered data may include personal information data that uniquely identifies or can be used to identify, locate, or contact a specific person. Such personal information data can include demographic data, location-based data, telephone numbers, email addresses, home addresses, data or records relating to a user's health or level of fitness (e.g., vital signs measurements, medication information, exercise information), date of birth, or any other identifying or personal information.

The present disclosure recognizes that the use of such personal information data, in the present technology, can be used to the benefit of users. For example, the personal information data can be used to activate or deactivate various functions of the user's device, or gather performance metrics for the user's device or the user. Further, other uses for personal information data that benefit the user are also contemplated by the present disclosure. For instance, health and fitness data may be used to provide insights into a user's general wellness, or may be used as positive feedback to individuals using technology to pursue wellness goals.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users, and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the US, collection of or access to certain health data may be governed by federal and/or state laws, such as the Health Insurance Portability and Accountability Act (HIPAA); whereas health data in other countries may be subject to other regulations and policies and should be handled accordingly. Hence different privacy practices should be maintained for different personal data types in each country.

Despite the foregoing, the present disclosure also contemplates embodiments in which users selectively block the use of, or access to, personal information data. That is, the present disclosure contemplates that hardware and/or software elements can be provided to prevent or block access to such personal information data. For example, in the case of advertisement delivery services, the present technology can be configured to allow users to select to "opt in" or "opt out" of participation in the collection of personal information data during registration for services or anytime thereafter. In another example, users can select not to provide mood-associated data for targeted content delivery services. In yet another example, users can select to limit the length of time mood-associated data is maintained or entirely prohibit the development of a baseline mood profile. In addition to providing "opt in" and "opt out" options, the present disclosure contemplates providing notifications relating to the access or use of personal information. For instance, a user may be notified upon downloading an app that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting location data at a city level rather than at an address level), controlling how data is stored (e.g., aggregating data across users), and/or other methods.

Therefore, although the present disclosure broadly covers use of personal information data to implement one or more various disclosed embodiments, the present disclosure also contemplates that the various embodiments can also be implemented without the need for accessing such personal information data. That is, the various embodiments of the present technology are not rendered inoperable due to the lack of all or a portion of such personal information data. For example, content can be selected and delivered to users by inferring preferences based on non-personal information data or a bare minimum amount of personal information, such as the content being requested by the device associated with a user, other non-personal information available to the content delivery services, or publicly available information.

What is claimed is:

1. An electronic device, comprising:
a frame defining a first part of an interior volume; and
a display stack including,
a cover attached to the frame and defining a second part of the interior volume;
an array of organic light-emitting diodes (OLEDs) comprising an array of emissive electroluminescent (EL) regions;
at least one organic photodetector (OPD) disposed between the cover and at least one emissive EL region in the array of emissive electroluminescent regions;
a touch sensor positioned between the array of OLEDs and at least one layer including the at least one OPD; and
an electrode positioned between the at least one OPD and the touch sensor and electrically connected to,
a surface of the at least one OPD; and
the touch sensor;
wherein the at least one emissive EL region emits electromagnetic radiation through the at least one OPD.

2. The electronic device of claim 1, wherein:
the display stack further comprises an OLED encapsulation layer positioned between the array of OLEDs and at least one layer including the at least one OPD.

3. The electronic device of claim 1, wherein:
the electrode positioned between the at least one OPD and the touch sensor is a first electrode; and
the at least one OPD comprises an OPD; and
the display stack further comprises,
a second electrode electrically connected to a second surface of the OPD; and
a thin-film transistor (TFT) backplane;
wherein at least one of the first electrode or the second electrode is electrically connected to the TFT backplane.

4. The electronic device of claim 1, wherein the at least one OPD comprises an OPD that overlaps an emissive EL region in the array of emissive EL regions in a one-to-one relationship.

5. The electronic device of claim 1, wherein the at least one OPD comprises an array of OPDs.

6. A display stack, comprising:
an array of organic light-emitting diodes (OLEDs) comprising an array of emissive electroluminescent (EL) regions;
at least one organic photodetector (OPD);
an OLED encapsulation layer positioned between the array of OLEDs and at least one layer including the at least one OPD;
a touch sensor positioned between the array of OLEDs and at least one layer including the at least one OPD; and
an electrode positioned between the at least one OPD and the touch sensor and electrically connected to,
a surface of the at least one OPD; and
the touch sensor;
wherein at least one emissive EL region emits electromagnetic radiation through the at least one OPD.

7. The display stack of claim 6, wherein the at least on OPD is disposed above at least one emissive EL region in the array of EL regions.

8. The display stack of claim 7, wherein the at least one OPD disposed above the at least one emissive EL region is partially or fully overlaps the at least one emissive EL region.

9. The display stack of claim 6, wherein the at least one OPD comprises an array of OPDs.

10. The display stack of claim 6, wherein the array of OLEDs is disposed below an exterior structural component through which an electronic image is displayed to a user.

11. The display stack of claim 6, wherein the at least one OPD corresponds to at least one OLED of the array of OLEDs.

12. The display stack of claim 6, wherein the at least OPD is disposed uniformly or non-uniformly over the array of OLEDs.

13. A display stack disposed in a frame of an electronic device, the display stack comprising:
- an array of organic light-emitting diodes (OLEDs) comprising an array of emissive electroluminescent (EL) regions;
- at least one organic photodetector (OPD);
- a touch sensor positioned between the array of OLEDs and at least one layer including the at least one OPD;
- a backplane; and
- a first electrode positioned between the at least one OPD and the touch sensor and electrically connected to,
  - a surface of the at least one OPD; and
  - the touch sensor;
- a second electrode electrically connected to a second surface of the at least one OPD and the backplane.

14. The display stack of claim 13, wherein at least one emissive EL region of the array of EL regions emits electromagnetic radiation through the at least one OPD.

15. The display stack of claim 13, wherein the first electrode is electrically connected to the backplane.

16. The display stack of claim 13, wherein the at least one OPD is disposed above at least one emissive EL region in the array of EL regions.

17. The display stack of claim 13, wherein the backplane comprises a thin-film transistor (TFT) backplane.

18. The display stack of claim 13, wherein the display stack further comprising:
- a third electrode electrically connected to,
  - a first surface of an OLED of the array of OLEDs; and
  - the backplane.

19. The display stack of claim 18, wherein the display stack further comprising:
- a fourth electrode electrically connected to,
  - a second surface of the OLED of the array of OLEDs; and
  - the backplane.

20. The display stack of claim 19, wherein:
the first surface is closer to the at least one OPD; and
the second surface is closer to the backplane.

* * * * *